United States Patent [19]
Hulyalkar

[11] Patent Number: 5,648,822
[45] Date of Patent: Jul. 15, 1997

[54] METHOD AND APPARATUS FOR COMBATING CO-CHANNEL NTSC INTERFERENCE USING A VARIABLE-COMB FILTER FOR DIGITAL TV TRANSMISSION

[75] Inventor: Samir N. Hulyalkar, White Plains, N.Y.

[73] Assignee: Philips Electronics North America Corporation, New York, N.Y.

[21] Appl. No.: 444,484

[22] Filed: May 19, 1995

[51] Int. Cl.$^6$ ..................................................... H04N 5/21
[52] U.S. Cl. ........................... 348/607; 348/608; 348/21; 348/609; 348/725
[58] Field of Search ...................... 348/607, 108, 348/609, 610, 611, 614, 725, 914, 21; 375/350; 455/306, 307; H04N 5/21, 5/213, 5/38

[56] References Cited

U.S. PATENT DOCUMENTS

| | | | |
|---|---|---|---|
| 4,833,693 | 5/1989 | Eyuboglu | 375/34 |
| 4,965,789 | 10/1990 | Bottau et al. | 370/79 |
| 5,086,340 | 2/1992 | Citta et al. | 358/141 |
| 5,087,975 | 2/1992 | Citta et al. | 358/183 |
| 5,162,900 | 11/1992 | Citta | 358/167 |
| 5,181,112 | 1/1993 | Citta et al. | 358/141 |
| 5,325,188 | 6/1994 | Scarpa | 348/624 |
| 5,349,589 | 9/1994 | Chennakeshu et al. | 371/43 |
| 5,452,015 | 9/1995 | Hulyalkar | 348/608 |
| 5,512,957 | 4/1996 | Hulyalkar | 348/607 |
| 5,550,596 | 8/1996 | Strolle | 348/607 |
| 5,572,249 | 11/1996 | Ghosh | 348/21 |

OTHER PUBLICATIONS

"Channel Coding with Multilevel/Phase Signals". IEEE Transactions on Information Theory, vol. IT–28, No. 1, pp. 55–67, Jan. 1982, by G. Ungerboeck.

"Reduced–State Sequence Estimation for Coded Modulation on Intersymbol Interference Channels", by M.V. Eyuboglu and S.U.H. Qureshi, IEEE Journal on Selected Areas in Communications, vol. 7, No. 6, pp. 989–995, Aug. 1989.
VBS Transmission System Grand Alliance, Feb. 18, 1994, pp. 1–19 and figs.

*Primary Examiner*—Sherrie Hsia
*Attorney, Agent, or Firm*—Edward W. Goodman

[57] ABSTRACT

A co-channel interference filter and a method for reducing co-channel interference for use in a television receiver. The television receiver receives a signal transmitted from a transmitter, the received signal having an encoded digital television signal component, a co-channel interference component, and a noise component, wherein the encoded digital television signal component is characterized as an N-level vestigial sideband (VSB) signal of Reed-Solomon (R-S) encoded, byte interleaved and trellis encoded symbols $c_{k,i}$ (for i=1 to 12), where N corresponds to a number of levels, and further wherein each symbol $c_{k,i}$ is derived from original symbol bits $a_{k,i}^1$ and $a_{k,i}^2$ (for i=1 to 12), respectively. The co-channel interference filter comprises a generator for generating a characteristic coefficient $\alpha$ in response to a received television signal, $\alpha$ being dependent upon an amount of the co-channel interference and noise components present in the received signal. A variable comb filter is filters the received signal and provides a filtered output signal, the variable comb filter having a characteristic response of $1-\alpha D^*$, wherein $D^*$ represents a delay of twelve VSB symbol intervals. An equalizer and phase tracker equalizes and phase tracks the filtered output signal, the equalizer and phase tracker outputting an effective output signal represented by an expression $d_{k,i}=c_k-60C_{k-1,i}$ (for i=1 to 12), where $d_{k,i}$ and $c_{k-1,i}$ further correspond to an instantaneous symbol and a delayed symbol, respectively. A trellis decoder, responsive to $\alpha$, trellis decodes the output signal $d_{k,i}$ and provides a trellis decoded output signal of symbol bits $â_{k,i}^1$ and $â_{k,i}^2$ of trellis decoded symbols, corresponding to original symbol bits $a_{k,i}^1$ and $a_{k,i}^2$, respectively, and further removes the ISI component introduced by the variable comb filter.

104 Claims, 14 Drawing Sheets

INPUT-
$a_k^1 a_k^2$ = 10 (SMALL DASHES) OR 11 (DOTTED LINE)

OUTPUT-
$d_k =$
$8\left(b_k^1 - \alpha b_{k-1}^1\right) +$
$4\left(a_k^2 - \alpha a_{k-1}^2\right) +$
$2\left(s_{k-1}^1 - \alpha s_{k-1}^2\right)$
$-7(1-\alpha)$

METHOD AND APPARATUS FOR COMBATING CO-CHANNEL NTSC INTERFERENCE USING A VARIABLE-COMB FILTER FOR DIGITAL TV TRANSMISSION

CROSS-REFERENCE TO COPENDING APPLICATIONS

U.S. patent applications (i) Ser. No. 08/197,773, filed on Feb. 10, 1994, entitled "Method and Apparatus for Combating Co-Channel NTSC Interference for Digital TV Transmission," assigned to the assignee of the present invention, now U.S. Pat. No. 5,452,015, and (ii) Ser. No. 08/230,360, filed on Apr. 20, 1994, entitled "Method and Apparatus for Combating Co-Channel NTSC Interference for Digital TV Transmission," assigned to the assignee of the present invention, now U.S. Pat. No. 5,512,957, the disclosure of each, which are hereby incorporated by reference into the present application, describes a related method and apparatus.

BACKGROUND OF THE INVENTION

1. Field of the Invention

This invention generally relates to a method and apparatus for combating co-channel NTSC interference for digital TV transmission, and more particularly, to the use of a variable-comb filter in combating co-channel NTSC interference for digital TV transmission.

2. Discussion of the Related Art

The Federal Communications Commission (FCC) and cable television testing organizations, such as CableLabs, have been evaluating digital television delivery systems in order to choose a new television "standard" which someday will replace NTSC in the United States. These systems all involve digital coding and data compression techniques, for example those utilizing Motion Picture Experts Group (MPEG) algorithms or variations thereof.

The FCC plans to test and approve an advanced television (ATV) standard for terrestrial broadcasting comprising, for example, high definition television (HDTV) and standard definition (SDTV) digital signals for terrestrial broadcasting. Although the specifics of the standard are yet to be fully tested and agreed upon, the FCC has indicated that the system will initially take the form of a so called "simulcast" approach. The new HDTV signals will have to fit into currently unused television channels (so-called "taboo" channels) and initially co-exist with conventional analog television signals without co-channel interference.

NTSC will be used hereinafter to represent one example of conventional television broadcasting. Other examples would be SECAM and PAL. Although NTSC is exemplified herein, it is not meant to be construed as a limitation and will be used herein synonymously with "conventional" to represent conventional television in general.

In 1994, the FCC tested a so-called "Grand Alliance" system, a system which is being developed cooperatively by corporate sponsors thereof who were involved in a first round of individual proposals tested by the FCC in 1991 and 1992. This newly developed system proposes to take the best features from those systems already tested. This is being done in order to present a single optimum system for FCC approval as the U.S. standard.

The Grand Alliance has decided on a coding algorithm which will comply with the source coding standards proposed by the MPEG. In addition, an RF transmission approach developed by Grand Alliance member Zenith Electronics Corporation was selected by the Grand Alliance. The RF transmission approach utilizes multi-level vestigial sideband (VSB) modulation which is described in "VSB Transmission System Grand Alliance: Technical Details", Feb. 18, 1994.

In the Grand Alliance system, a comb-filtering approach is used to alleviate the degradation in performance of the "simulcast" HDTV transmission system caused by a co-channel conventional television transmission. This comb-filtering approach is based on an appropriate choice of symbol-rate and center frequency of a digital TV signal, which then allows the use of a comb-filter with a delay element of 12 symbol intervals to effectively remove the visual, sound, as well as the chrominance carders corresponding to the interfering co-channel NTSC spectrum (as described in "VSB Transmission System Grand Alliance: Technical Details").

However, when a co-channel NTSC spectrum is absent, the use of a post-comb filter at the HDTV receiver causes an undesirable loss in error performance of 3 dB when only Additive Wide Gausian Noise (AWGN) is present. This loss is due to the structure of the comb filter. Such a comb filter has a single delay of 12 symbols adding to a direct symbol path thus causing noise to be added as well. Such a system is discussed in U.S. Pat. No. 5,086,340, incorporated herein by reference.

A trellis encoder is used in conjunction with 8 VSB modulation in the Grand Alliance system. The use of the trellis encoder in conjunction with the 8 VSB modulation actually causes a loss of 3.5 dB in noise performance when used in combination with a comb filter, as discussed in "VSB Transmission System Grand Alliance: Technical Details". Hence, in the Grand Alliance system, an alternate path is provided at the receiver for a case when co-channel NTSC is absent. Such an alternate path eliminates the use of the comb filter at the receiver via a switching action. A decision on whether to use the comb filter at the receiver or not is determined by a measured error-rate of periodically sent data field sync symbols at the outputs of a circuit with the comb filter and a circuit without the comb filter, respectively. Whichever measured error is smallest at the end of a preset period determines whether or not the comb filter is used. Such a switching action between a comb filter circuit and a no-comb filter circuit is cumbersome and unreliable.

Another problem with this comb-filtering approach is that when both co-channel interference and AWGN are present, a performance of the comb filter degrades dramatically. This is because the AWGN, after the comb filter, does not remain white, but gets "colored". This coloring of the AWGN affects the performance of a trellis decoder used in the HDTV receiver, noting that the trellis decoder is optimized for performance in an AWGN channel. Since a co-channel conventional television interference is maximum at a fringe area where a signal power is small and hence a noise component is large, this is indeed a scenario which must be taken into account.

One method to avoid degradation in performance when both co-channel NTSC and AWGN are present is to use a variable comb filter at the receiver as discussed in U.S. Pat. Nos. 5,162,900 and 5,087,975, incorporated herein by reference. Unfortunately, the variable comb filter arrangements of the '900 and '975 patents are subject to error-propagation. That is, a single decision error can cause multiple decision errors, and hence, cause a degradation in performance which may, in certain cases, be more than the degradation caused by using only a comb filter.

Another problem associated with using a variable comb filter is related to the use of a trellis-decoder in the HDTV receiver. In the Grand Alliance system, a four-state rate ⅔ trellis code is used in signal transmission. When a comb filter is not used in the HDTV receiver, a corresponding decoder comprises a four-state Viterbi decoder as discussed in "Channel Coding with Multilevel/Phase Signals", IEEE Transactions on Information Theory, vol. IT-28, no. 1, pp. 55–67, January 1982, by G. Ungerboeck.

On the other hand, when a comb filter is used for co-channel interference mitigation, the trellis decoding strategy now implements Viterbi decoding on an expanded trellis, the states of which correspond to the cascade of the states of the comb-filter and the trellis coder as is known in the art. That is, for a comb-filter with a delay of 12 symbols, the number of trellis states are extremely large. To simplify the Viterbi decoder, the Grand Alliance system converts the MPEG-coded and RS-coded and interleaved data-stream from serial to parallel, then uses 12 parallel trellis encoders followed by a parallel to serial converter at the transmitter. An optimal Viterbi decoder for use with a comb filter after the trellis encoder would require a 16-state decoder. This 16-state decoder implementation can be simplified to an 8-state decoder by using special properties associated with the comb filter resulting in a very small loss in performance, as will be explained herein below.

In contrast, when a variable comb filter is used, the optimal decoder is still a 16-state Viterbi decoder. However, simplification of the 16-state Viterbi decoder to an 8-state Viterbi decoder for use in conjunction with the variable comb filter is not possible without a significant loss in performance. Hence, for a variable comb filter, the trellis decoding strategy appears to have a much higher complexity.

Another problem associated with the variable comb filter is related to the synchronization symbols, and more specifically, the segment sync symbols introduced in the Grand Alliance transmission system. The segment sync symbols are used to derive accurate timing and framing information at the receiver. During a time in which the segment sync symbols are transmitted, the trellis-coders, whose outputs would correspond to the segment sync symbols, are frozen, i.e., no data is input to these trellis coders. After transmitting the segment symbols, the next symbol to be transmitted corresponds to the next encoder in sequence after the frozen trellis encoders. In other words, the segment sync symbols are not inserted into the trellis-coded stream, but rather replace the outputs of trellis encoders which correspond to the segment sync symbols.

For the receiver utilizing a comb filter, it is easy to show that the effect of the segment sync can be removed by adding two received data values corresponding to the symbols associated during and after transmission of the segment sync symbol. In contrast, however, this method results in a degradation in performance for the receiver utilizing a variable comb filter as the variable comb filter enhances the noise.

SUMMARY OF THE INVENTION

An object of the present invention is to overcome the problems in the art discussed above.

An object of the present invention is to provide a variable comb filter implementation which changes from a no-comb-filter solution to a comb-filter solution in a smooth manner thus providing an improved performance when both a co-channel interference as well as an additive noise is present.

Another object of the present invention is to provide a co-channel interference filter for achieving improved performance which requires no discrete switching between the no-comb-filter solution and the comb-filter solution.

Still another object of the present invention is to minimize an error-propagation effect due to the use of a variable comb filter. Such an object is achieved through use of a modified slicer (i.e., a decision device associated with VSB decoding).

Still another object of the present invention is the implementation of a whole class of sub-optimal 4-state or 8-state Viterbi decoders which have reduced complexity as compared to an optimal 16-state Viterbi decoder required for the variable comb filter implementation.

Yet still another object of the present invention is that the variable comb filter can be optimized to the level of co-channel interference by constantly monitoring the received signal. A method to implement such a monitoring technique is described herein.

Still another object of the present invention is that the performance of the variable comb filter is not degraded when the segment symbols are sent. In fact, noise enhancement is actually lessened or made smaller.

According to the present invention, a co-channel interference filter is described for use in a television receiver. The television receiver receives a signal transmitted from a transmitter, the received signal having an encoded digital television signal component, a co-channel interference component, and a noise component. The encoded digital television signal component is characterized as an N-level vestigial sideband (VSB) signal of Reed-Solomon (R-S) encoded, byte interleaved and trellis encoded symbols $c_{k, i}$ (for i=1 to 12), where N corresponds to a number of levels, and wherein each symbol $c_{k, i}$ is derived from original symbol bits $a_{k, i}^1$ and $a_{k, i}^2$ (for i=1 to 12), corresponding to a most-significant symbol bit and a least significant symbol bit, respectively. The co-channel interference filter comprises a characteristic coefficient generator means for generating a characteristic coefficient $\alpha$ in response to the received signal, wherein $\alpha$ is dependent upon an amount of the co-channel interference and noise components present in the received signal at a prescribed time and further wherein $\alpha$ comprises a value in the range of $0 \leq \alpha \leq 1$. A variable comb filter means filters the received signal and provides a filtered output signal, the variable comb filter means having a characteristic response of $1-\alpha D^*$, wherein $D^*$ represents a delay of twelve VSB symbol intervals, further wherein the filtered output signal comprises an intersymbol interference (ISI) component. An equalizer anti phase tracker means equalizes and phase tracks the filtered output signal of the variable comb filter means, the equalizer and phase tracker means outputting an effective output signal represented by an expression $d_{k, i} = c_{k, i} - \alpha c_{k-1, i}$ (for i=1 to 12), where $c_{k, i}$ and $c_{k-1, i}$ further correspond to an instantaneous symbol and a delayed symbol, respectively. Lastly, a trellis decoder means responsive to $\alpha$ trellis decodes the output signal $d_{k, i}$ of the equalizer and phase tracker means, the trellis decoding means providing a trellis decoded output signal of symbol bits $\hat{a}_{k, i}^1$ and $\hat{a}_{k, i}^2$ of trellis decoded symbols, corresponding to original symbol bits $a_{k, i}^1$ and $a_{k, i}^2$, respectively, and further removing the ISI component introduced by the variable comb filter.

In addition, according to the present invention, a method of reducing co-channel interference in a received television signal, a television receiver incorporating a co-channel interference filter, and a method of receiving a television signal having reduced co-channel interference are also disclosed herein.

BRIEF DESCRIPTION OF THE DRAWINGS

The foregoing and other teachings and advantages of the present invention will become more apparent upon a detailed description of the best mode for carrying out the invention as rendered below. In the description to follow, reference will bettered to the accompanying drawings in which like reference numerals are carried forward, and in which.

DETAILED DESCRIPTION OF THE PREFERRED EMBODIMENTS

Figure 1:
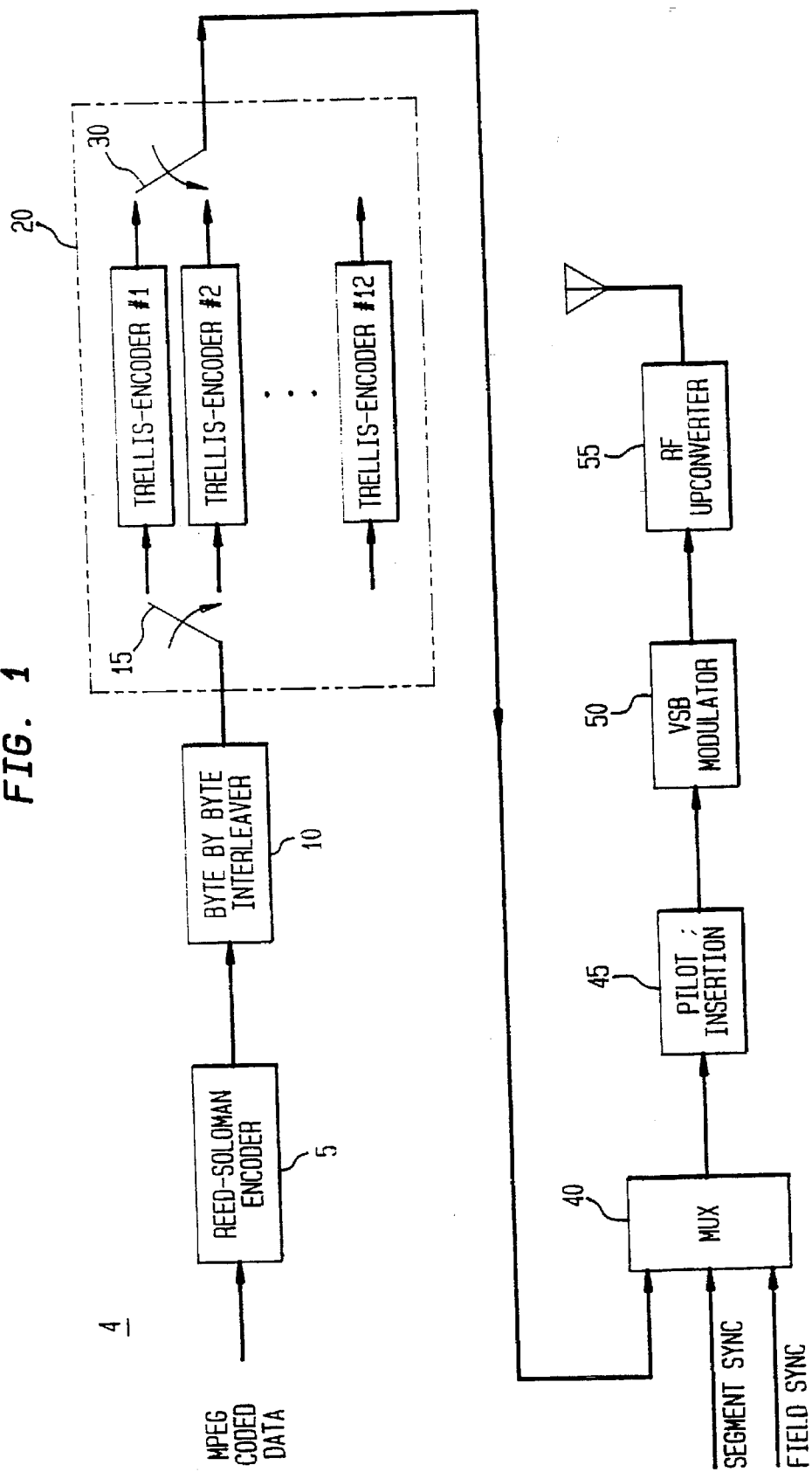
FIG. 1 shows a block diagram of a VSB transmitter.

Turning now to FIG. 1, a known VSB HDTV transmitter 4 shall be briefly discussed. Such a VSB transmitter can comprise one such as that used by the Grand Alliance, as described in "VSB Transmission System Grand Alliance: Technical Details". Briefly, the VSB transmitter operates to transmit an encoded digital television signal. That is, digital data (for example, comprising MPEG encoded television) is passed through a Reed-Solomon (RS) encoder 5 and a byte interleaver 10. The bytes output by the byte interleaver 10 are broken up into symbols and then multiplexed into a bank of twelve (12) trellis encoders 20, as shown in FIG. 1, using switches 15 and 30. Care is taken to make sure that symbols from a given byte are always sent through a given trellis encoder. All trellis encoders 20 are similar and are subsequently described herein with reference to FIG. 5.

Referring still to FIG. 1, the output of switch 30 is passed through a multiplexer (MUX) 40. In addition to the output of switch 30, MUX 40 also multiplexes any training signals, for example, a segment sync or a field sync, that may be present in accordance to a particular sequence being transmitted. The output of MUX 40 comprises a multiplexed stream of signals which is then passed through a pilot inserter 45, a VSB modulator 50, and lastly, an RF up-converter 55. RF up-converter 55 up-converts its input signal and causes a digital television signal to be radiated over the HDTV terrestrial channel. All of the blocks 5, 10, 20, 40, 45, 50, 55 are known in the art and thus only briefly discussed herein.

Figure 2:
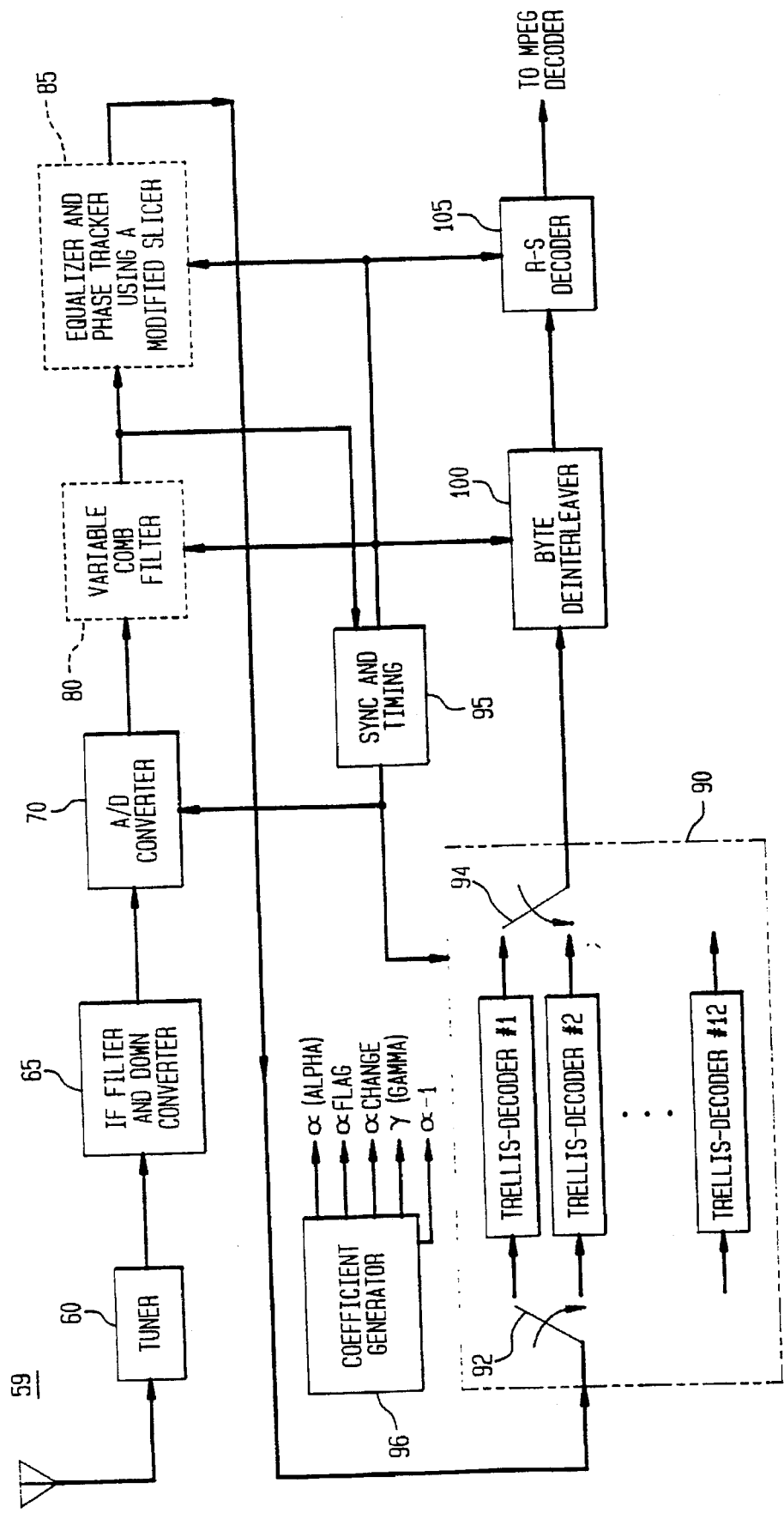
FIG. 2 shows a block diagram of a VSB receiver and a co-channel interference filter according to the present invention.

Turning now to FIG. 2, the VSB HDTV receiver 59 and a method of receiving an HDTV signal comprising the present invention shall be discussed. A tuner 60 selects an HDTV channel of interest and converts a received signal from RF to IF, wherein the received signal comprises one transmitted by a VSB transmitter as discussed hereinabove. The IF signal is then sent to an IF filter and down-converter 65. IF filter and down-converter can comprise, for example, a SAW filter, which shapes a signal spectrum according to a filter used in the VSB modulator 50, followed by a mixer which down-converts the signal spectrum to a baseband signal. Tuner 60 and IF filter and down-converter 65 are known in the art and thus only briefly discussed herein.

An analog-to-digital (A/D) converter 70 samples an input signal at a desired symbol-rate, such as 10.76 MHz. A variable comb filter 80, described in more detail herein with respect to FIG. 3, then processes an output signal of the A/D converter 70 and passes it to an equalizer and phase tracker 85. Equalizer and phase tracker 85 shall be discussed in more detail herein with respect to FIGS. 4 and 5.

An output of the equalizer and phase tracker 85 is selectively passed through a bank of twelve (12) trellis decoders 90 in a prescribed manner via switches 92 and 94, the bank of trellis decoders 90 corresponding to the twelve (12) trellis encoders 20 of the VSB transmitter 4. Many optimal and sub-optimal configurations of the trellis decoders are possible as will be described in further detail with respect to FIGS. 7, 9, 11, 13 and 14. An output of a desired or selected one of the trellis decoders is then passed through a byte de-interleaver 100 and an RS decoder 105. Byte de-interleaver 100 and RS decoder 105 are known in the art and thus only briefly discussed herein. A sync and timing block 95 controls a clocking for each of the digital signal processing blocks and also the A/D converter 70, as is known in the art. Lastly, a coefficient generator 96 provides a characteristic coefficient $\alpha$, as well as other characteristic parameters, including $(1-\alpha)$, $\alpha_{flag}$, $\alpha_{change}$, and $\gamma$, as defined and further explained herein below. Coefficient generator 96 may comprise any suitable device, such as a microprocessor, microcontroller, and/or circuitry for implementing the desired functions in accordance with known programming and circuit design techniques.

Figure 3:
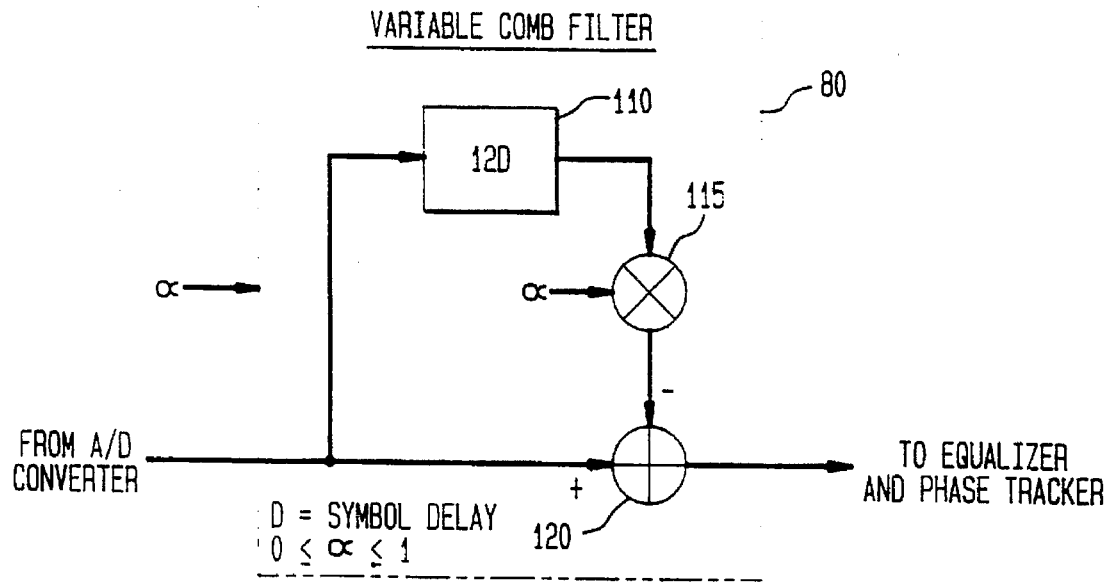
FIG. 3 shows a variable comb filter as used in accordance with the present invention.

Turning now to FIG. 3, variable comb filter 80 comprises a summer 120 for summing a direct signal path and a delayed signal path, wherein the delayed signal path contains a delay element 110. With respect to delay element 110, each delay D is equal to one symbol interval. In addition, one symbol interval corresponds to the reciprocal of the A/D sampling rate of 10.76 MHz. The delayed signal path is multiplied by characteristic coefficient $\alpha$ using a multiplier 115. The value of $\alpha$ is dependent on an amount of co-channel interference and noise that is present in the received signal at any given time, to be further explained herein below. Characteristic coefficient $\alpha$ is further restricted to lie within the set of values in $0 \leq \alpha \leq 1$.

Figure 4:
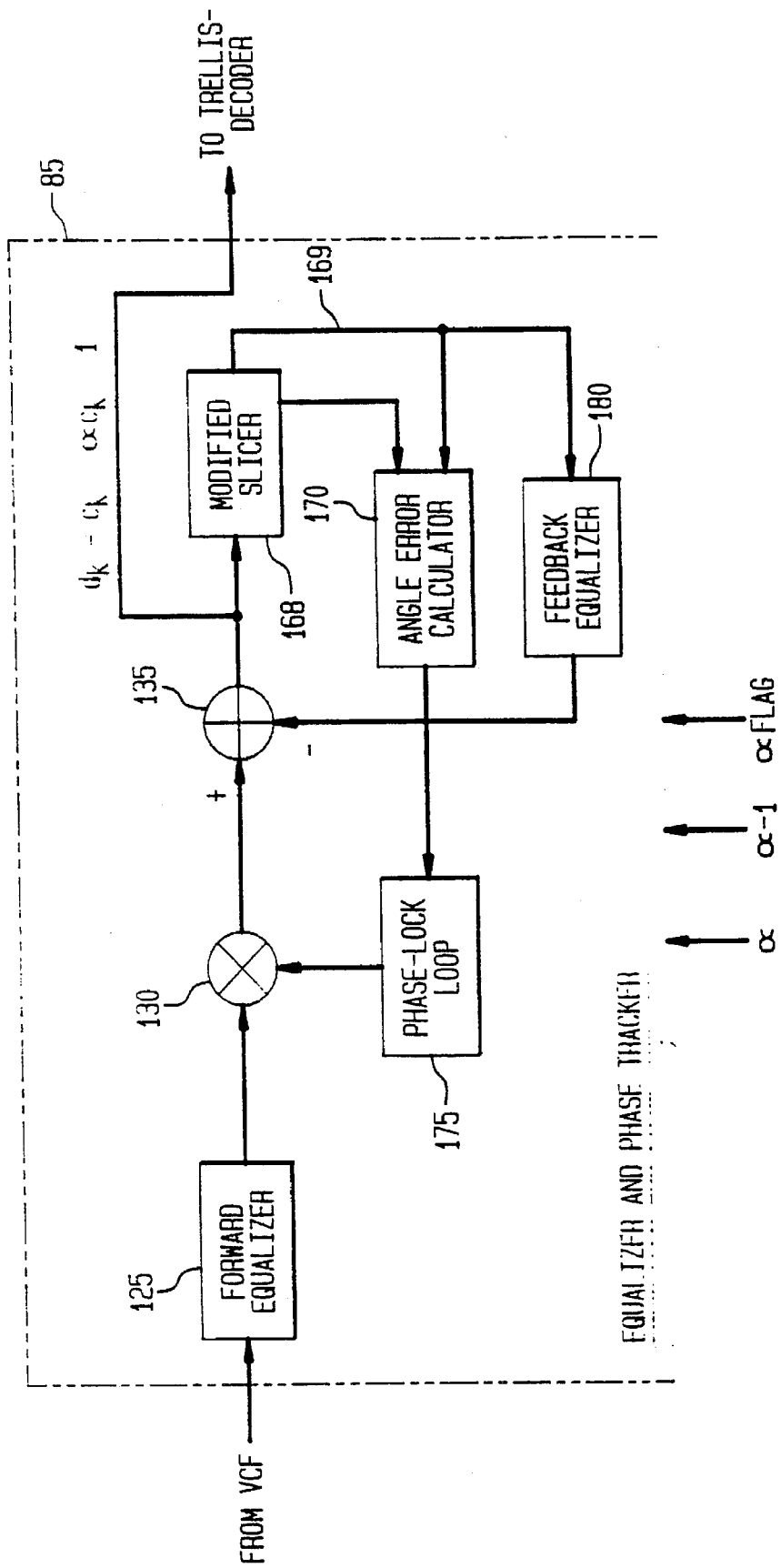
FIG. 4 shows an equalizer and the phase tracker using a modified slicer in accordance with the present invention.

Turning now to FIG. 4, equalizer and phase tracker 85 comprises a forward equalizer 125, the phase offset of which is removed using a multiplier 130. Multiplier 130 is fed a phase offset value from an angle-error calculator 170 and a phase-lock-loop 175. The output of multiplier 130 contains a residual intersymbol interference component introduced therein by a channel which is removed through the use of a feedback equalizer 180 and adder 135.

Figure 5:
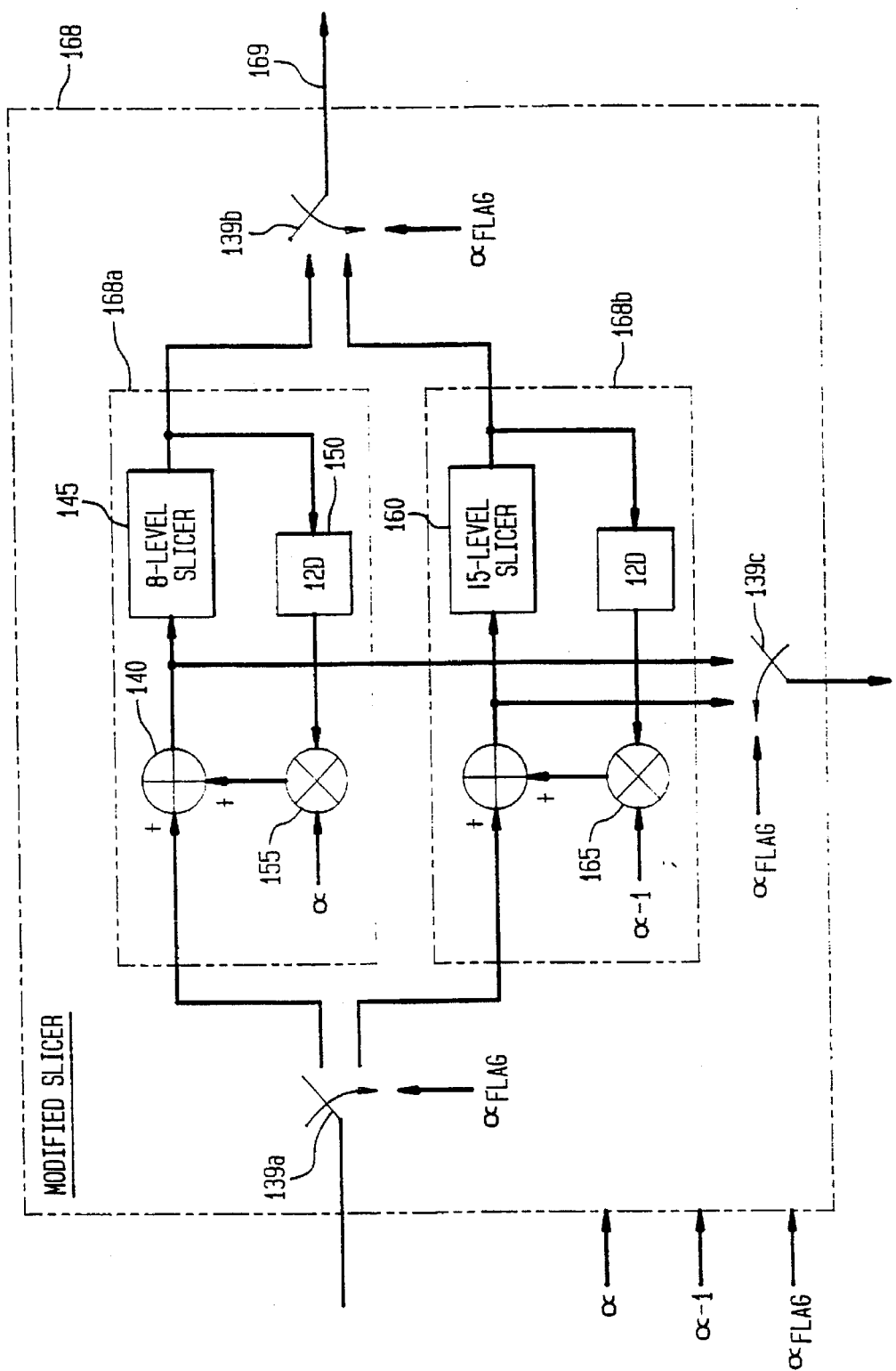
FIG. 5 shows the modified slicer of FIG. 4 in greater detail.

Referring to FIGS. 4 and 5, the feedback equalizer 180 and the angle-error calculator 170 are coupled to an output 169 of a "modified" slicer 168. The modified slicer 168 comprises a first section 168a, a second section 168b, and appropriate controllable switches 139a, 139b, and 139c for selectively connecting a respective input/output to either the first section or the second section, 168a or 168b, as shown and as further described below. A desired one of either section 168a or section 168b is selected according to whether a value of $\alpha_{flag}$ is either 0 or 1, wherein the parameter $\alpha_{flag}$ is made to depend on the value of $\alpha$. That is, when $0 \leq \alpha \leq 0.5$, $\alpha_{flag}$ equals zero, otherwise it equals 1.

Referring still to FIG. 5, the upper section 168a is selectively connected and used when $\alpha_{flag}$ equals zero. Similarly, the lower section 168b is selectively connected and used when $\alpha_{flag}$ equals one. Lower section 168b is provided to reduce an error-propagation in the present invention, i.e., the cascade of errors produced as a result of a single error, as will be explained further herein below.

When the variable comb filter 80 is used, an intersymbol interference (ISI) term is introduced. Prior to the making of any data decisions by the equalizer and phase tracker 85, this ISI term must be removed. Removal of the ISI term is accomplished using a feedback term. For the upper section 168a of FIG. 5, the use of an 8-level slicer 145, in addition to using a feedback structure comprising a delay element 150 and a multiplier 155 with the coefficient $\alpha$, further in conjunction with an adder 140, the ISI term can be removed. This ISI removal is accurate only when the symbol used to remove the ISI term has been correctly decoded previously. If there is an error in this previously decoded symbol, then such an error may cause the current symbol also to be in error. This effect is called error-propagation, since a current symbol can cause a future symbol also to be in error.

In conjunction with the ISI removal, the above-mentioned error-propagation can be advantageously minimized if the value of the coefficient which multiplies the previously decoded symbol is kept small. Recall that the upper section 168a is selected only when $\alpha_{flag}$ equals zero, therefore the maximum absolute value of $\alpha$ is 0.5.

When $\alpha$ is greater than 0.5, the lower section 168b is used. Lower section 168b is similar to upper section 168a with the following differences in the use of a 15-level slicer 160 along with a multiplier 165 with a coefficient ($\alpha-1$). Clearly, error-propagation is limited, since the maximum absolute value of the feedback coefficient ($\alpha-1$) is 0.5.

While characteristic coefficient $\alpha$ is assumed to be time-varying, a switching between the upper and lower sections, 168a and 168b, respectively, of the modified slicer 168 is implemented only when a field sync is received. This is because the feedback equalizer 180 must be adapted to the correct slicer (i.e., either the 8-level slicer 145 or the 15-level slicer 160, as the case may be) before data decisions can be passed.

As a result of the modified slicer structure, error-propagation can be reduced to a minimum. To further avoid any effect of error-propagation from propagating to the rest of the system, the output of summer 135 is sent to the trellis decoders 90. Note that the output of summer 135 still has an ISI term therein because of the variable comb filter 80. This ISI term can be removed effectively using novel trellis decoding structures which will be described below.

Figure 6:
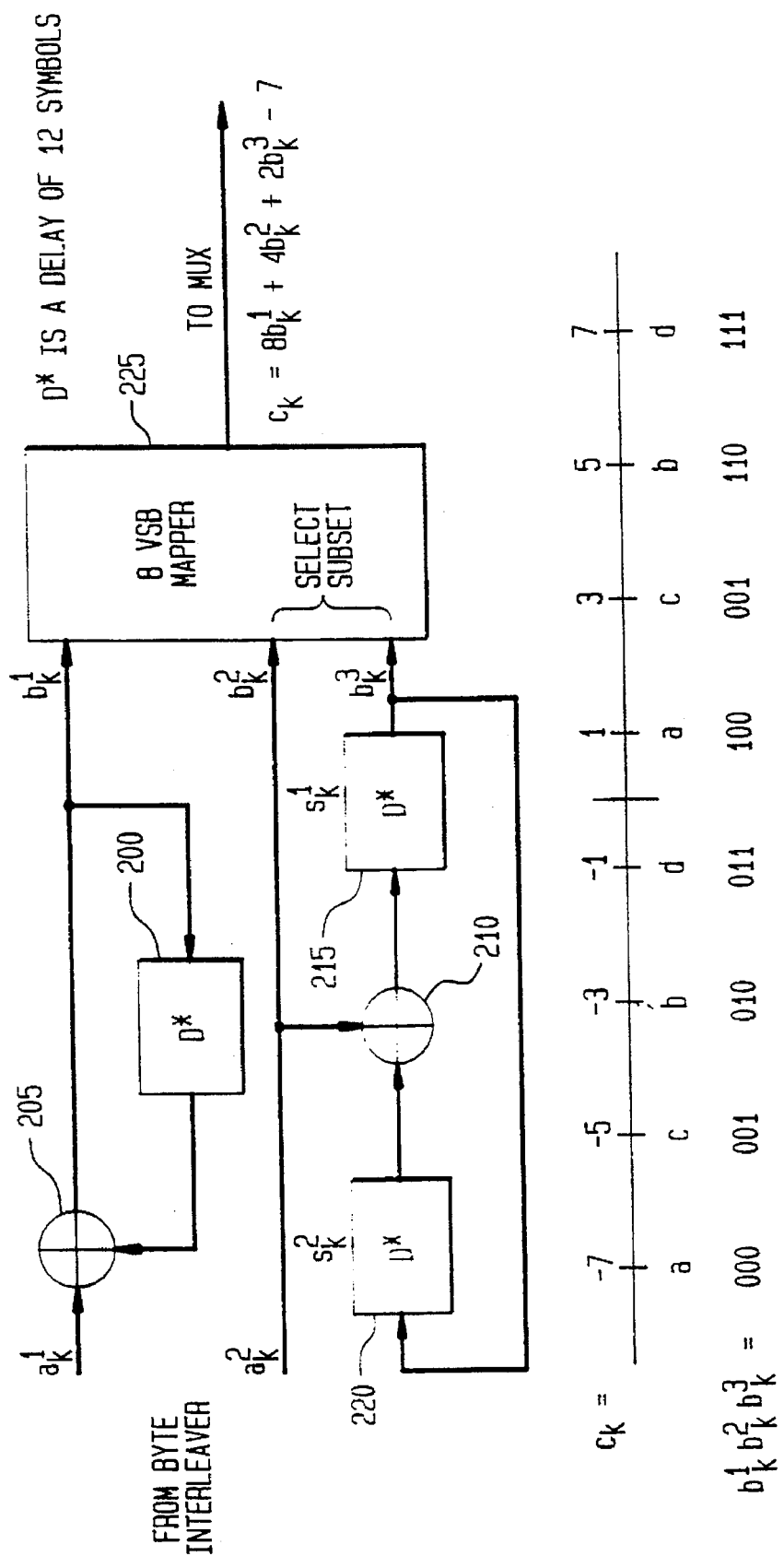
FIG. 6 illustrates a trellis encoder as used in the VSB transmitter of FIG. 1.

To better understand the trellis decoding structures, first let us consider the trellis encoder 20 as shown in FIG. 6, further in conjunction with FIG. 1 also. As explained earlier, the bytes output by the byte interleaver 10 are broken up into symbols and then multiplexed into the twelve (12) trellis encoders 20 using switches 15 and 30 (FIG. 1). Each symbol is represented by two bits $a_{k,i}^1$ and $a_{k,i}^2$ (for i=1 to 12 corresponding to a respective trellis encoder), as shown in FIG. 6. The MSB (most significant bit) $a_{k,i}^1$ is pre-coded using a modulo adder 205 and the delay element 200 to produce $b_{k,i}^1$. The LSB (least significant bit) $a_{k,i}^2$ is passed through a rate ½ encoder as described in "Channel Coding with Multilevel/Phase Signals" (previously cited) to create two coded bits $b_{k,i}^2$ and $b_{k,i}^3$, which select one of the four subsets 'a', 'b', 'c' and 'd' as shown in FIG. 6. A four-state encoder is used, which uses a delay element 220 and 215 and a modulo adder 210. The contents of the delay elements 215 and 220 represent the states $s_{k,i}^1$ and $s_{k,i}^2$, respectively, of the $i^{th}$ trellis encoder (other state definitions are also possible).

The bits $b_{k,i}^1$, $b_{k,i}^2$ and $b_{k,i}^3$ together describe the output of the 8 VSB mapper 225 which outputs $c_{k,i} = 8 b_{k,i}^1 + 4 b_{k,i}^2 + 2 b_{k,i}^3 - 7$ (for i=1 to 12). This output is then sent to the MUX 40.

If no channel were present, $c_{k,i}$ would appear at the input to the trellis decoder 90 when a variable comb filter 80 is not being used, i.e., $\alpha=0$. A four-state trellis decoder can be constructed via known methods using the trellis encoder information described with respect to FIG. 6.

Figure 7:
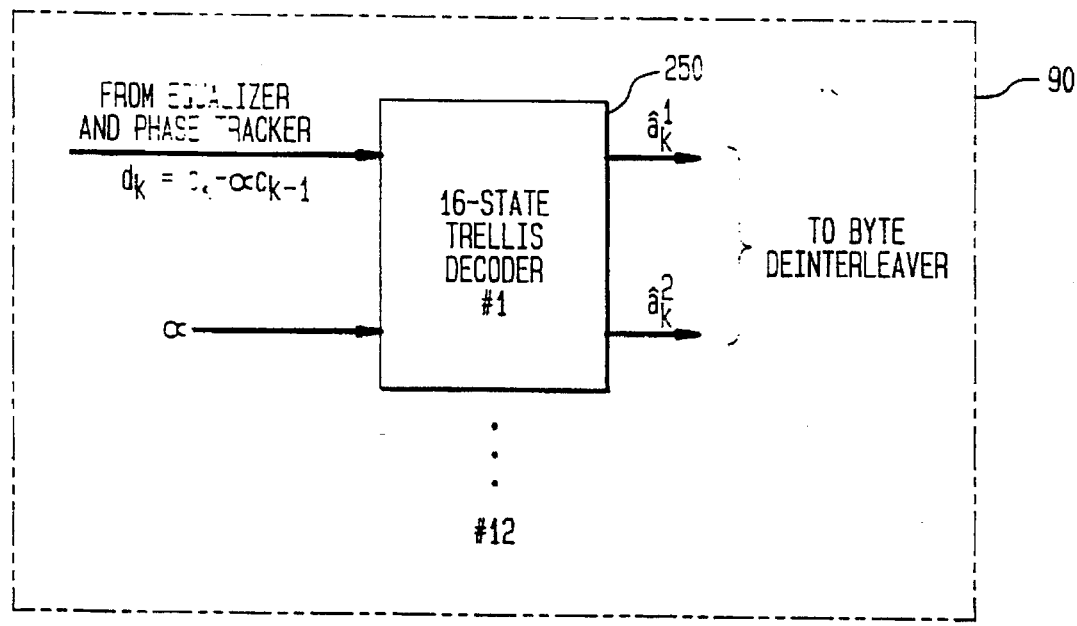
FIG. 7 shows an optimal 16-state trellis decoder for use with the variable comb filter, in accordance with the present invention.
Figure 8A:
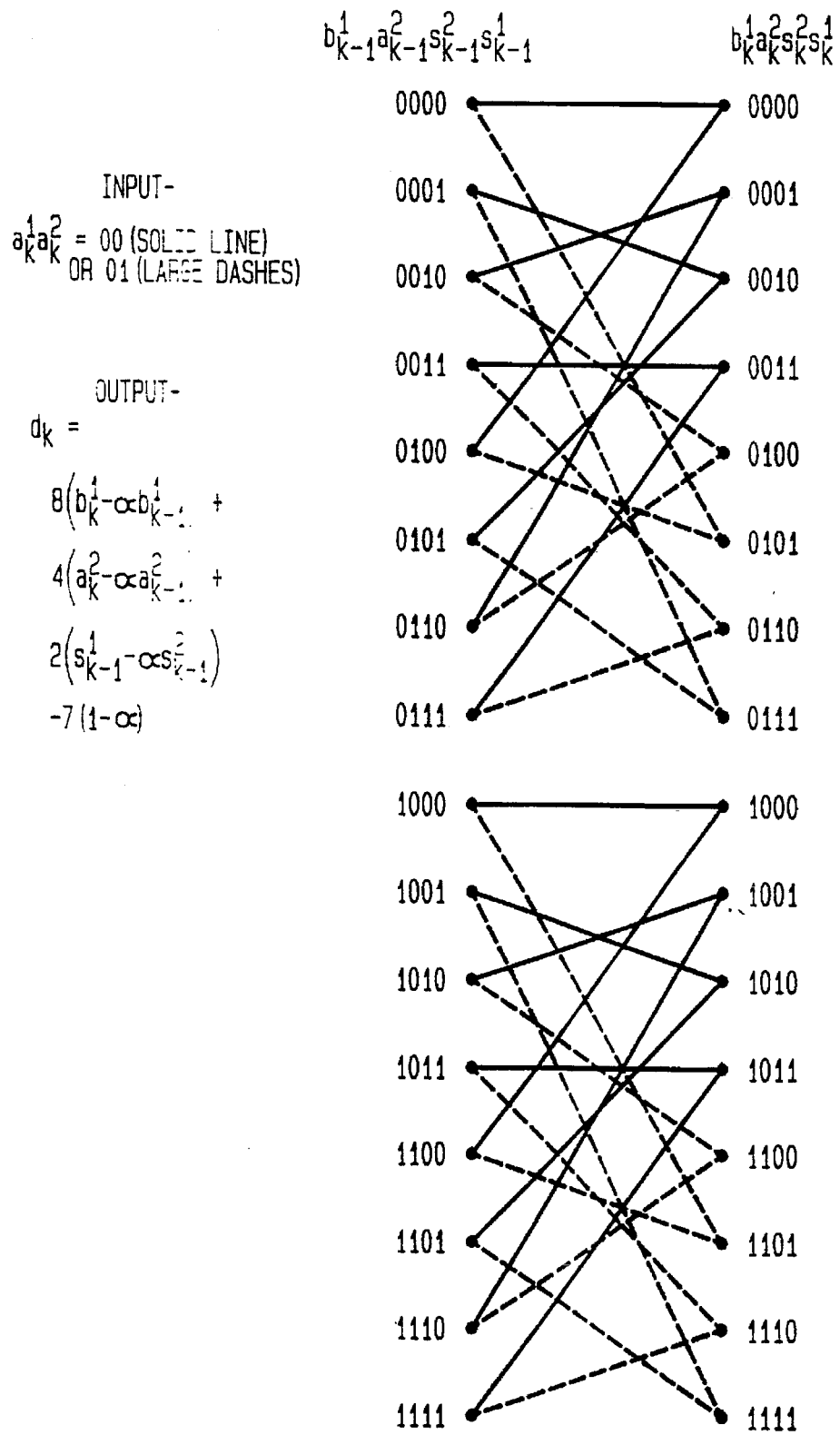
FIGS. 8a and 8b describe a transition diagram of the 16-state trellis used by the trellis decoder of FIG. 7.
Figure 8B:
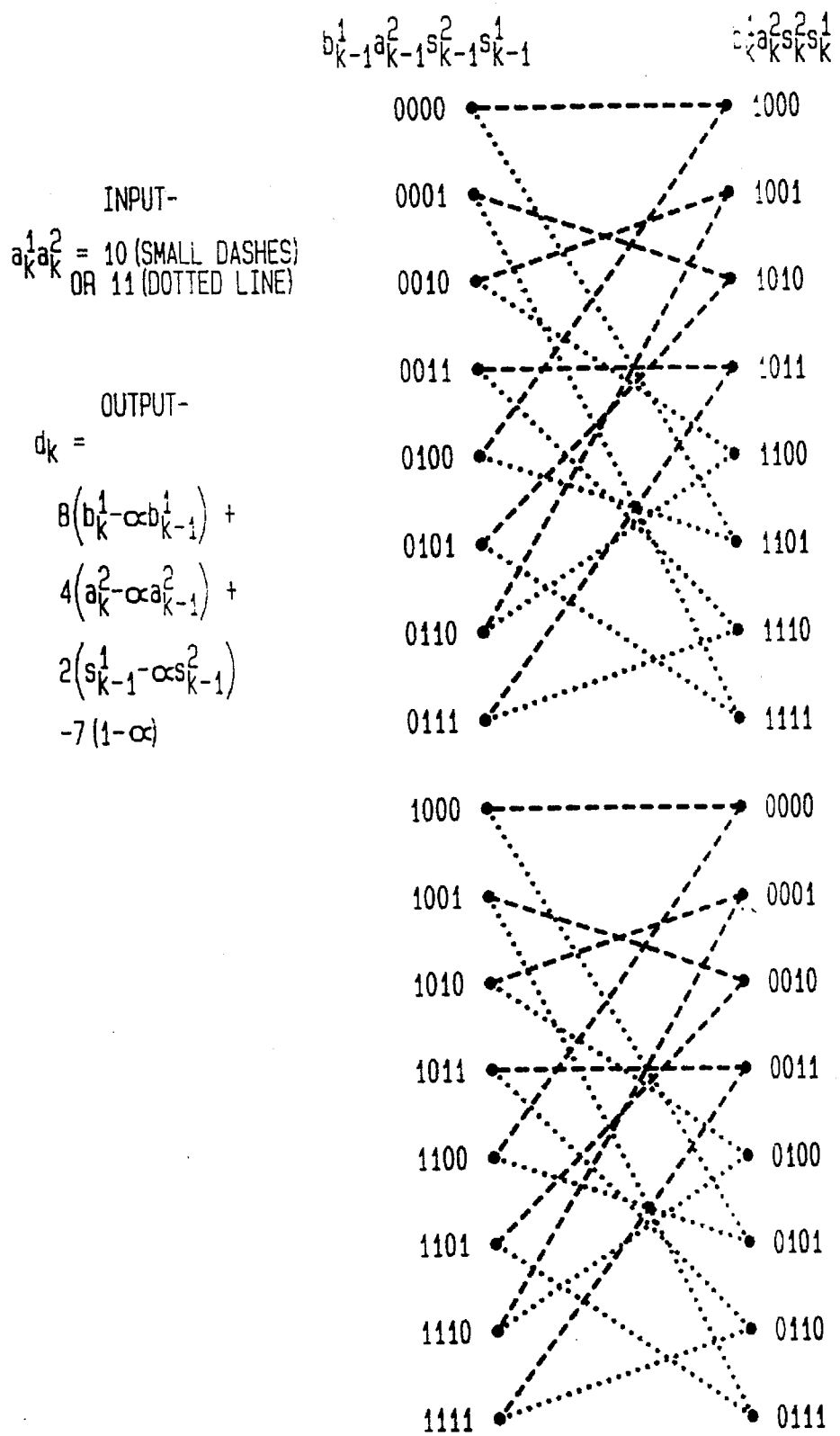

If a variable comb filter is present, then the input to each trellis decoder 90 is actually the quantity $d_{k,i} = c_{k,i} - \alpha c_{k-1,i}$ (for i=1 to 12 corresponding to a respective trellis decoder), where $c_{k,i}$ and $c_{k-1,i}$ further correspond to an instantaneous symbol and a delayed symbol, respectively. An optimal trellis decoder in this case comprises a 16-state trellis decoder 250 as shown in FIG. 7. The inputs to the trellis decoder 250 are $d_{k,i}$ and $\alpha$. The trellis decoder 250 operates on the trellis shown in FIGS. 8a and 8b.

Each state of the 16-state trellis can be described by the values of $b_{k,i}^1$, $a_{k,i}^2$, $s_{k,i}^1$ and $s_{k,i}^2$. A state transition occurs when $a_{k,i}^1$ and $a_{k,i}^2$ are the inputs. Hence, there are four possible inputs. The output during each state transition can be computed from:

$$d_{k,i} = 8(b_{k,i}^1 - \alpha b_{k-1,i}^1) + 4(a_{k,i}^2 - \alpha a_{k-1,i}^2) + \quad \text{(EQ 1)}$$
$$2(s_{k-1,i}^1 - \alpha s_{k-1,i}^2) - 7(1 - \alpha)$$

(for i = 1 to 12)

Using this description of the 16-state trellis, a Viterbi decoder can be implemented by methods known in the art. The output of the 16-state decoder would comprise bits $â_{k,i}^1$ and $â_{k,i}^2$ of trellis decoded symbols, which correspond to original transmitted symbol bits $a_{k,i}^1$ and $a_{i,i}^2$ with possible errors.

It is noted that the 16-state trellis is much more complicated than the four-state trellis decoder for the case when $\alpha=0$. Thus, as described in the following, a class of trellis decoders may be utilized which have a fewer number of states and provide similar performance. Such a class of trellis decoders is based on an observation that the variable comb filter 80 is simply a channel with a response $(1-\alpha D)$.

For trellis codes used with a channel, which has an arbitrary channel response, maximum-likelihood (ML)

decoding techniques known in the art may be utilized. In this regard, the 16-state code described above effectively uses the ML decoding technique for a channel with response $1-\alpha D$. In an article entitled "Reduced-State Sequence Estimation for Coded Modulation on Intersymbol Interference Channels", by M. V. Eyuboglu and S. U. H. Qureshi, IEEE Journal on Selected Areas in Communications, Vol. 7, No. 6, pp. 989–995, August 1989, a method to reduce the number of states when a trellis code is used with a channel with arbitrary channel response is described. In particular, parallel-decision feedback decoding (PDFD) is of interest.

Figure 9:
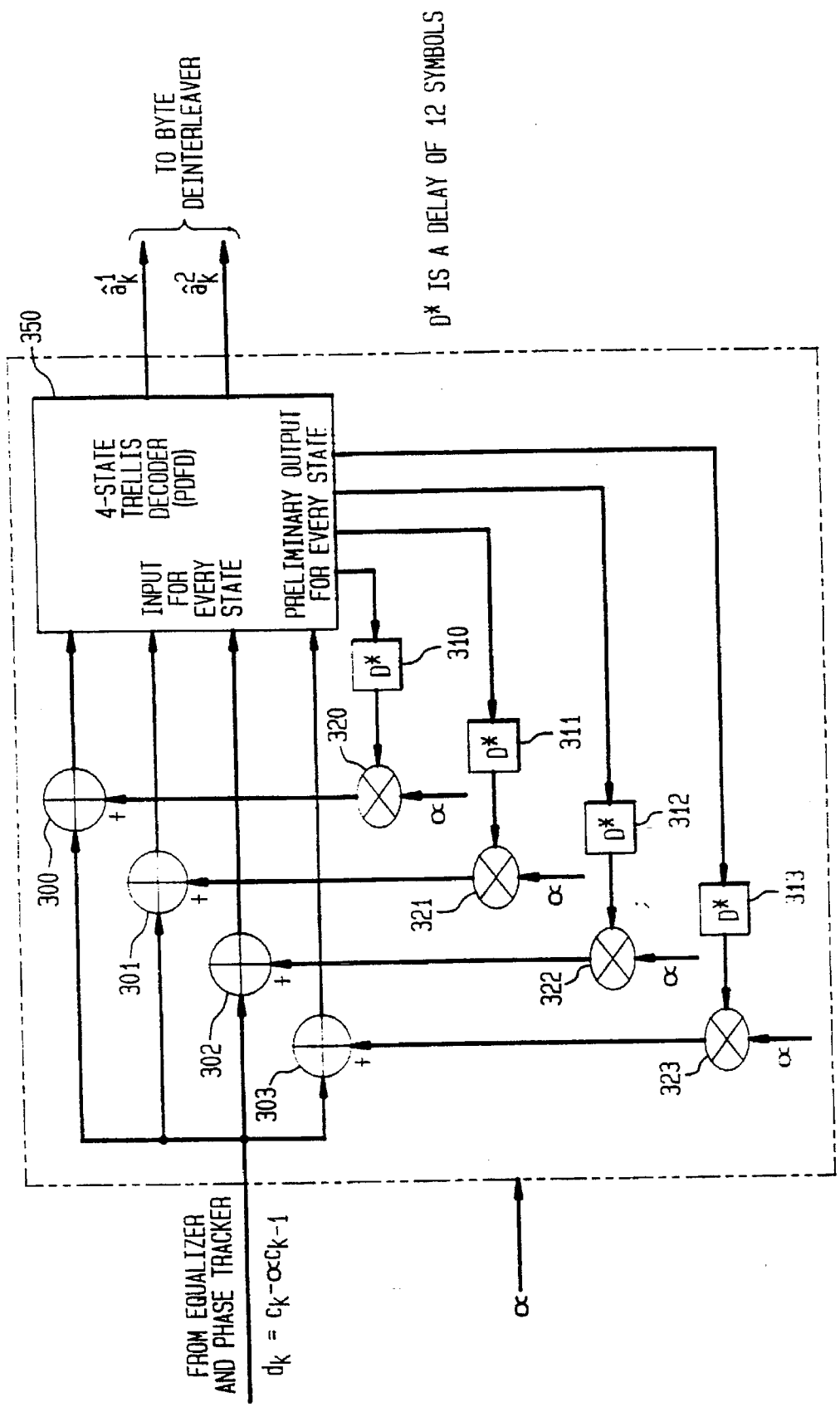
FIG. 9 illustrates a suboptimal 4-state trellis decoder using parallel-decision feedback decoding (PDFD), in accordance with an alternate embodiment of the present invention.

FIG. 9 shows a four-state trellis decoder using PDFD. Since $d_{k,i} = c_{k,i} - \alpha c_{k-1,i}$ (for i=1 to 12), if somehow, information about $c_{k-1,i}$ is available, then a four-state code (which operates on information available on $c_{k,i}$ only) can be used. $c_{i-1,i}$ can be obtained from the previous output of the $i^{th}$ trellis-decoder. Unfortunately, there is an inherent delay in the processing of the trellis-decoder before the trellis-decoder output can be reliable. If an immediate decision is made of the previous symbol at every stage, then the trellis decoder will suffer from an error-propagation effect as described earlier.

One way to minimize this error-propagation is by using PDFD. In this case, for every state, an estimate is made of a previous symbol which may not be an overall estimate of the previous symbol for all the states. Hence, as shown in FIG. 9, the four-state decoder 350 must generate a "preliminary" output decision of a previous symbol for every state. Now for a next transition, for each of these states, the effect of the previous symbols must be separately removed using adders 300, 301, 302, and 303 to which are input corresponding outputs of multipliers 320, 321, 322, and 323 which use delay elements 310, 311, 312, and 313, respectively.

Figure 10:
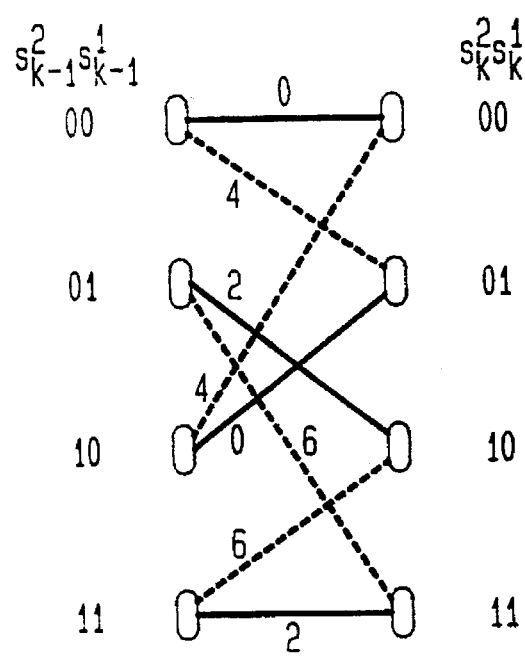
FIG. 10 describes a transition diagram of the 4-state trellis used by the decoder of FIG. 9.

The four-state decoder of FIG. 9 uses the trellis shown in FIG. 10. Here the states are represented by the values of the bits $s_{k,i}^1$ and $s_{k,i}^2$. The input is $a_{k,i}^2$ and the output is $e_{k,i}$ which is defined as:

$$e_{k,i} = 4(b_{k,i}^2 - \alpha\, b_{k-1,i}^2) + 2(b_{k,i}^3 - \alpha\, b_{k-1,i}^3), \qquad (EQ\ 2)$$

(for $i = 1$ to 12)

and equals $4a_{k,i}^2 + 2s_{k-1,i}^1$, when a=0. This output is labeled on the different branches as shown in FIG. 10.

The four-state trellis description also suffers from error propagation even though PDFD is used. As explained earlier, error propagation becomes more severe when the value of $\alpha$ is large. A trellis decoder will now be described (shown in FIG. 11) which limits error propagation by using a switching arrangement and technique similar as described for the case of the modified slicer 168.

Figure 11:
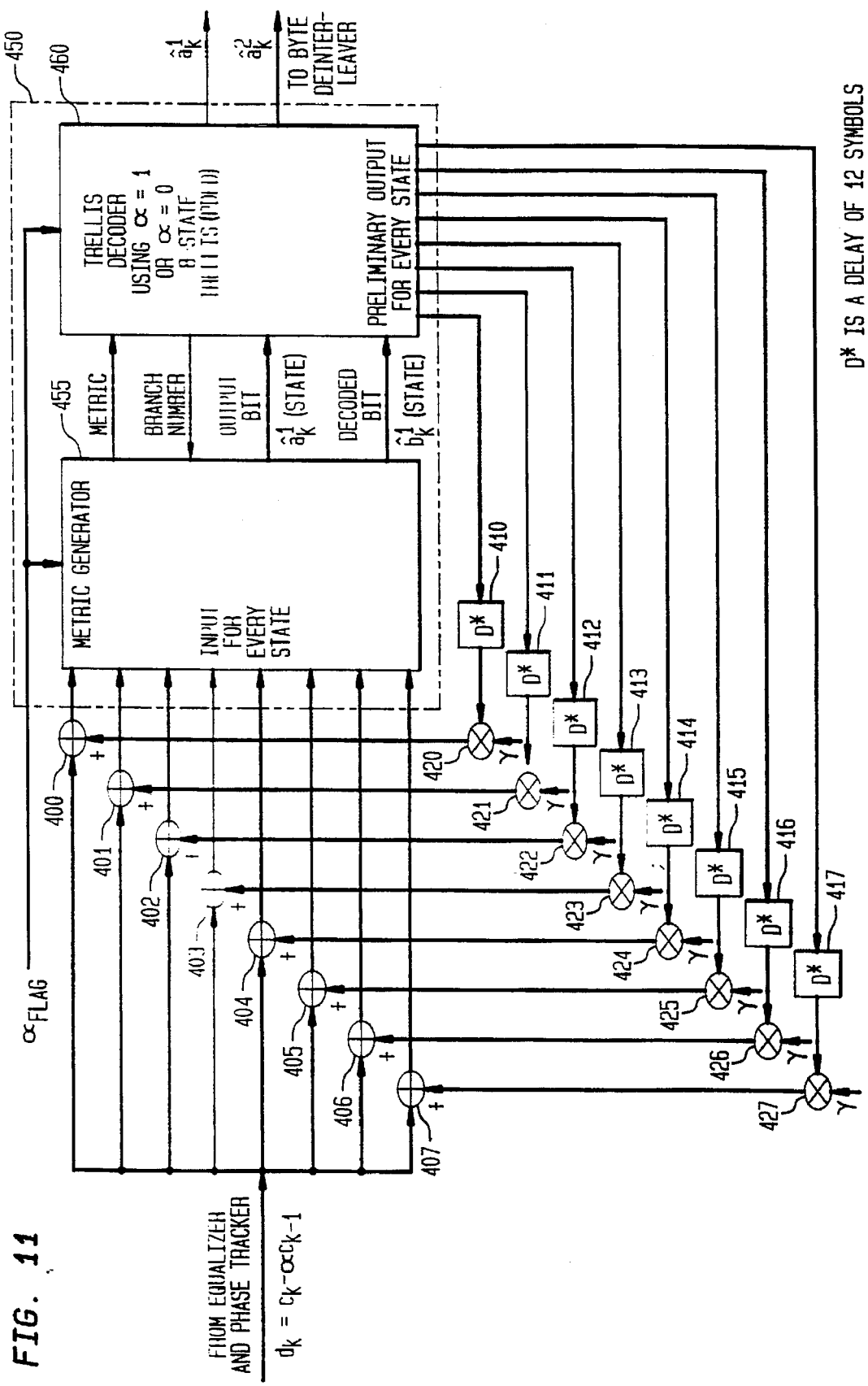
FIG. 11 illustrates a suboptimal 8-state trellis decoder using parallel-decision feedback decoding (PDFD), in accordance with an alternate embodiment of the present invention.

The principal idea behind the switching arrangement and technique described for the case of the modified slicer 168 was that the input to the slicer be either $c_{k,i}$ or $c_{k,i} - c_{k-1,i}$. For the first case when the input is $c_{k,i}$, an 8-level slicer is used. In the latter case when the input is $c_{k,i} - c_{k-1,i}$, a 15-level slicer is used. It is possible to describe two trellises with 8-states for these two different cases. Since the input to the $i^{th}$ trellis decoder is still $d_{k,i} = c_{k,i} - \alpha c_{k-1,i}$, even when the trellis decoder is operating the two trellises, a method must be found such that the input to the trellis decoder observes either $c_{k,i}$ or $c_{k,i} - c_{k-1,i}$. Again PDFD can be used, where now the previous symbol is generated from all the eight states. FIG. 11 shows an eight-state decoder 450 using PDFD where either the $\alpha=0$ or the $\alpha=1$ trellises are used depending on a value of $\alpha_{flag}$. The feedback terms use delay elements 410–417 and multipliers 420–427 which is added to the input using adders 400–407, respectively. The coefficient of all the multipliers is given by:

$$\gamma = \begin{cases} \alpha, & \text{when } 0 \leq \alpha \leq 0.5 \\ \alpha - 1, & \text{otherwise.} \end{cases} \qquad (EQ\ 3)$$

Figure 12:
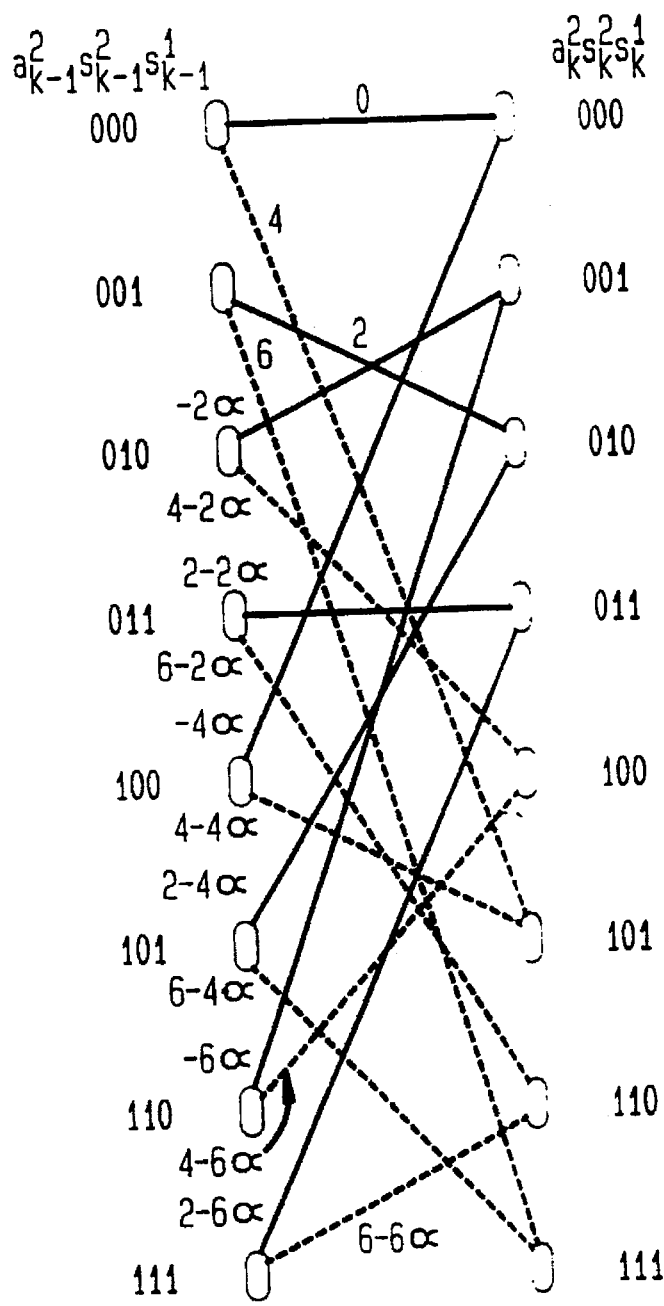
FIG. 12 describes a transition diagram of the 8-state trellis used by the decoder in FIG. 11.

The trellis representation for either $\alpha=0$ or $\alpha=1$ is shown as a more general case for arbitrary values of $\alpha$ in FIG. 12. Here the states are represented by the values of the bits $a_{k,i}^2$, $s_{k,i}^1$ and $s_{k,i}^2$. The input is $a_{k,i}^2$ and the output is $e_{k,i}$ which is labeled on the different branches as shown in FIG. 12.

Referring once again to FIG. 11, trellis decoder 450 can be conceptually divided into two parts; a metric generator 455 and a trellis decoder 460. The trellis decoder 460 implements a Viterbi algorithm on the eight-state trellis specified by the trellis described in FIG. 12 for either of the $\alpha=0$ or the $\alpha=1$ cases, depending on the value of $\alpha_{flag}$. The trellis decoder 460 receives a branch metric from the metric generator 455 by first specifying a branch of interest by using a unique branch number. Given the branch number, a previous state number is uniquely specified which then selects one of the eight inputs.

As previously discussed, if no decoding errors are made, then an input to the metric generator 455 for any state is either $d_{k,i}$ or $c_{k,i} - c_{k-1,i}$ depending on the value of $\alpha_{flag}$. However, when additive noise corrupts this input, it is known that an optimal method of demodulation is achieved by minimizing a Euclidean distance between a received signal and all possible values of the transmitted signals. Thus, if $\alpha_{flag}$ equals zero, the branch metric is given by $$\min_{b_{k,i}^1} |d_{k,i} - 8\, b_{k,i}^1 - e_{k,i}(\text{branch with } \alpha = 0)|^2, \qquad (EQ\ 4)$$

(for $i = 1$ to 12)

where a minimization is effectuated by implementing a slicer based on whether $b_{k,i}^1$ equals one or zero. The value of $e_{k,i}$ (branch) is obtained from the trellis diagram shown in FIG. 12 for a given branch by setting $\alpha=0$. The metric generator 455 also outputs the value of the $\hat{b}_{k,i}^1$ (state) which provides the minimum value of the metric in Eq (4). This is required to construct the previous output symbol for every state as shown in FIG. 11. Finally, the metric generator 455 also outputs the value:

$$\hat{a}_{k,i}^1 \text{ (state)} = \hat{b}_{k,i}^1 \text{ (state)} \oplus \hat{b}_{k-1,i}^1 \text{ (previous state)} \qquad (EQ\ 5)$$

(for $i = 1$ to 12).

The value of $\hat{b}_{k-1,i}^1$ (previous state) must either be stored in the metric generator 455 or can also be passed to the metric generator 455 from the trellis decoder 460. Thus when the Viterbi decoder picks the path that minimizes the Euclidean distance between the received signal and all possible paths, then the output of the Viterbi decoder is not only $\hat{a}_{k,i}^2$ which is uniquely determined from the given path in the trellis of FIG. 12, but also $\hat{a}_{k,i}^1$ which is associated to a particular state as shown in Eq (5).

If $\alpha_{flag}$ equals one, then the branch metric is given by:

$$\min_{b_{k,i}^1 - b_{k-1,i}^1} |d_{k,i} - 8(b_{k,i}^1 - b_{k-1,i}^1) - e_{k,i}(\text{branch with } \alpha = 1)|^2, \qquad (EQ\ 6)$$

(for $i = 1$ to 12).

Note that $(b_{k,i}^1 - b_{k-1,i}^1)$ can have values of 1, 0 or −1, which does not reduce the distance between the subsets corresponding to the trellis encoder described with respect to FIG. 6. However, a slicer can be used to determine the branch metric corresponding to all possible values of ($b_{k,i}^1 - b_{k-1,i}^1$).

The value of $â_{k,i}^1$ (state) is obtained very easily by observing Table 1 as given below. As can be seen from Table 1, clearly if ($b_{k,i}^1 - b_{k-1,i}^1$) equals zero, then $â_{k,i}^1$ (state) is zero; otherwise it equals one.

TABLE 1

Table showing the relationship between $â_{k,i}^1$, $b_{k,i}^1$, and $b_{k-1,i}^1$.

| $â_{k,i}^1$ | $b_{k-1,i}^1$ | $b_{k,i}^1$ | ($b_{k,i}^1 - b_{k-1,i}^1$) |
|---|---|---|---|
| 0 | 0 | 0 | 0 |
| 0 | 1 | 1 | 0 |
| 1 | 0 | 1 | 1 |
| 1 | 1 | 0 | −1 |

Similarly, the value of $\hat{b}_{k,i}^1$ (state) can also be determined. When ($b_{k,i}^1 - b_{k-1,i}^1$) equals one then $b_{k,i}^1$ equals one. When ($b_{k,i}^1 - b_{k-1,i}^1$) equals minus one (−1) then $b_{k,i}^1$ equals zero. Finally, when ($b_{k,i}^1 - b_{k-1,i}^1$) equals zero then $b_{k,i}^1 = b_{k-1,i}^1$.

Lastly, $\alpha_{flag}$ determines which strategy is used to implement the metric generator 455. Note that it is possible to change from one strategy to another without any interruption, since the feedback is of only one symbol.

The feedback structure of FIG. 11, while reducing error-propagation, have introduced some complexity in terms of implementation of the feedback terms as shown. It should be realized that the feedback tern represented by $c_{k-1,i}\gamma$ is $$(8 \gamma)b_{k-1,i}^1 + (4 \gamma)b_{k-1,i}^2 + (2 \gamma)b_{k-1,i}^3, \quad \text{(EQ 7)}$$

(for $i = 1$ to 12)

which can be implemented simply by using shift registers, adders and multiplexers.

The feedback structure of FIG. 11 can be simplified even further by adopting a technique herein defined as "partial" PDFD (PPDFD). That is, instead of providing information about the entire previous symbol $c_{k-1,i}$, only the information about $b_{k-1,i}^1$ is provided. This results in the received signal at the trellis decoder being a noise-corrupted version of either:

$$8b_{k,i}^1 + 4(b_{k,i}^2 - \alpha\, b_{k-1,i}^2) + 2(b_{k,i}^3 - \alpha\, b_{k-1}^3, \quad \text{(EQ 8)}$$

(for $i = 1$ to 12)

or $$8(b_{k,i}^1 - b_{k-1,i}^1) + 4(b_{k,i}^2 - \alpha\, b_{k-1,i}^2) + 2(b_{k,i}^3 - \alpha\, b_{k-1}^3, \quad \text{(EQ 9)}$$

(for $i = 1$ to 12)

depending on whether $\alpha_{flag}$ equals zero or one, respectively. Effectively, the difference in this case as compared to the previous case is that the trellis decoder now operates on a trellis for any given value of $\alpha$ in FIG. 12. The metric generator operates exactly like the metric generator described in FIG. 11.

Figure 13:
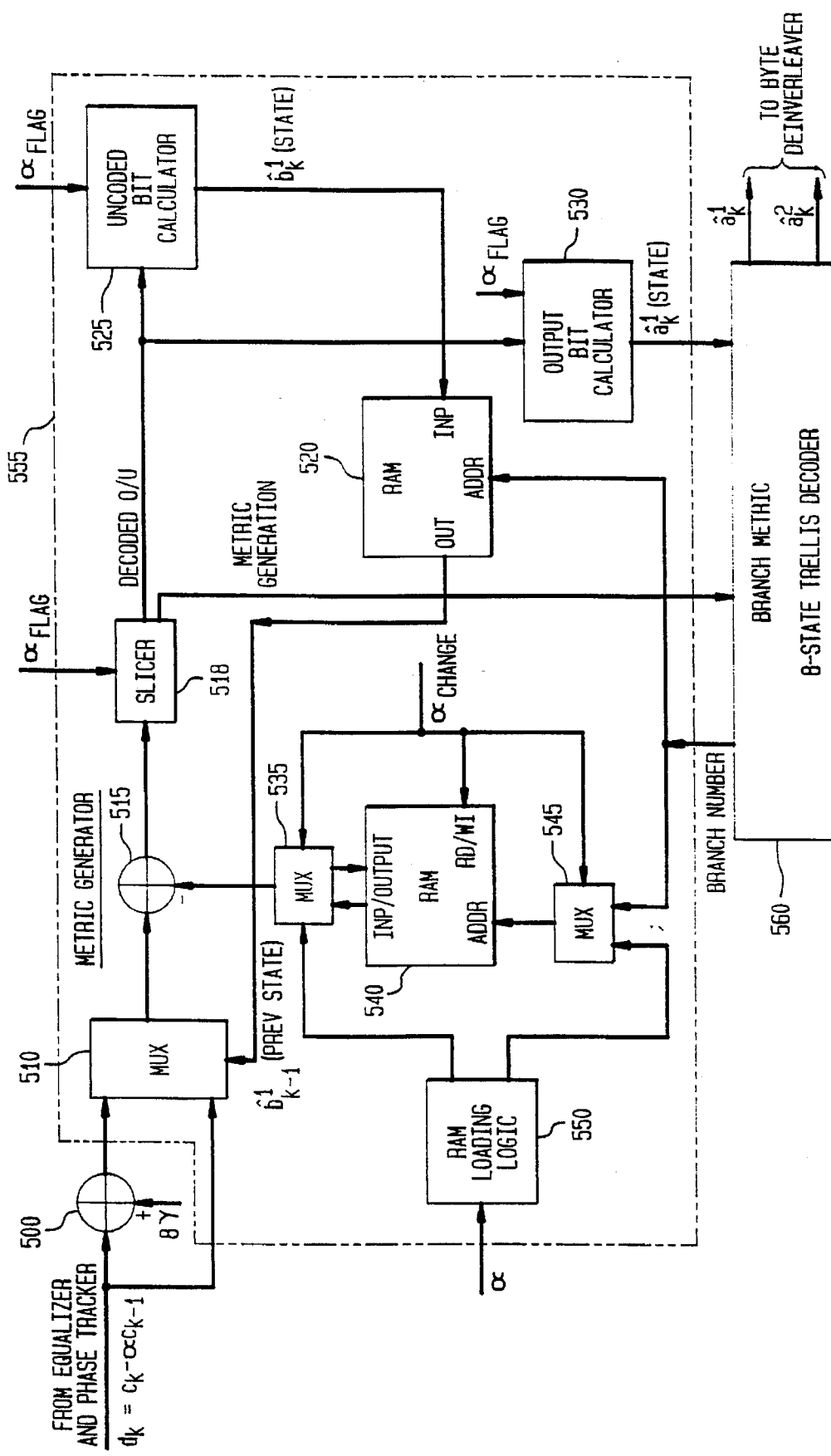
FIG. 13 shows a suboptimal 8-state trellis decoder using partial parallel-decision feed-back decoding (PPDFD), in accordance with an alternate embodiment of the present invention.

FIG. 13 describes the eight-state trellis decoder with PPDFD. The equalizer 85 output is sent directly to a MUX 510, as shown. Another input to the MUX 510 comprises a result of an adder 500 whose coefficient is 8γ. The combination of the MUX 510 and the adder 500 implements a feedback path for a specific value of $\hat{b}_{k-1,i}^1$ (previous state), as shown.

In this latter case, the metric is either:

$$\min_{b_{k,i}^1} |d_{k,i} - 8b_{k,i}^1 - e_{k,i}(\text{branch with arbitrary } \alpha)|^2, \quad \text{(EQ 10)}$$

(for $i = 1$ to 12)

or $$\min_{b_{k,i}^1 - b_{k-1,i}^1} |d_{k,i} - 8(b_{k,i}^1 - b_{k-1,i}^1) - \quad \text{(EQ 11)}$$

$$e_{k,i}(\text{branch with arbitrary } \alpha)|^2,$$

(for $i = 1$ to 12).

depending on whether $\alpha_{flag}$ equals zero or one, respectively.

The above-mentioned metric calculation for a specific branch is accomplished as follows. The 8-state trellis decoder 560 specifies the branch number which addresses a RAM 540 which has the correct value of $e_{k,i}$ (branch with arbitrary $\alpha$) which is subtracted from the output of the MUX 510 using the adder 515 as shown in FIG. 13. The output of the adder 515 is then sent to the slicer 518 which implements the minimization in Eq (10) or Eq (11) depending on whether $\alpha_{flag}$ equals zero or one, respectively.

To allow for an arbitrary loading of values of $\alpha$, MUXES 535 and 545 are used to load the RAM 540 by using a RAM loading logic module 550. The RAM loading logic module 550 sequentially computes the value of $e_{k,i}$ (branch with arbitrary $\alpha$) for all the branches in the trellis of FIG. 12 in a prescribed specified order. An input $\alpha_{change}$ is shown which is set such that the RAM 540 is loaded whenever a prescribed "significant" change in the value of ce is observed, e.g., according to the particular requirements of the specific application.

Referring still to FIG. 13, slicer 518 also generates the value of $b_{k,i}^1$ or ($b_{k,i}^1 - b_{k-1,i}^1$) depending on whether $\alpha_{flag}$ equals zero or one, respectively. The output of slicer 518 is used by an uncoded bit calculator 525 to generate $\hat{b}_{k,i}^1$ (state), and by an output bit calculator 530 to generate $â_{k,i}^1$ (state). The two modules, i.e., the uncoded bit calculator 525 and the output bit calculator 530, operate in a similar manner as the operation of metric generator 455 (of FIG. 11) for implementing these functions using Table 1.

The output of the uncoded bit calculator 525 is stored in RAM 520, which when appropriately selected by a branch number output of the trellis decoder 560, produces the bit $\hat{b}_{k-1,i}^1$ (previous state). Bit $\hat{b}_{k-1,i}^1$ (previous state) selects MUX 510 as shown and implements a desired feedback path.

Referring still to FIG. 13, the 8-state trellis decoder 560 comprises a Viterbi decoder which outputs $â_{k,i}^1$ and $â_{k,i}^2$ as described earlier for the 8-state trellis decoder 460 of FIG. 11. The only difference between the two decoders is that the 8-state trellis decoder 560 does not implement the feedback path as described earlier for the 8-state trellis decoder 460. This feedback is actually implemented in the metric generator 555 of FIG. 13.

Figure 14:
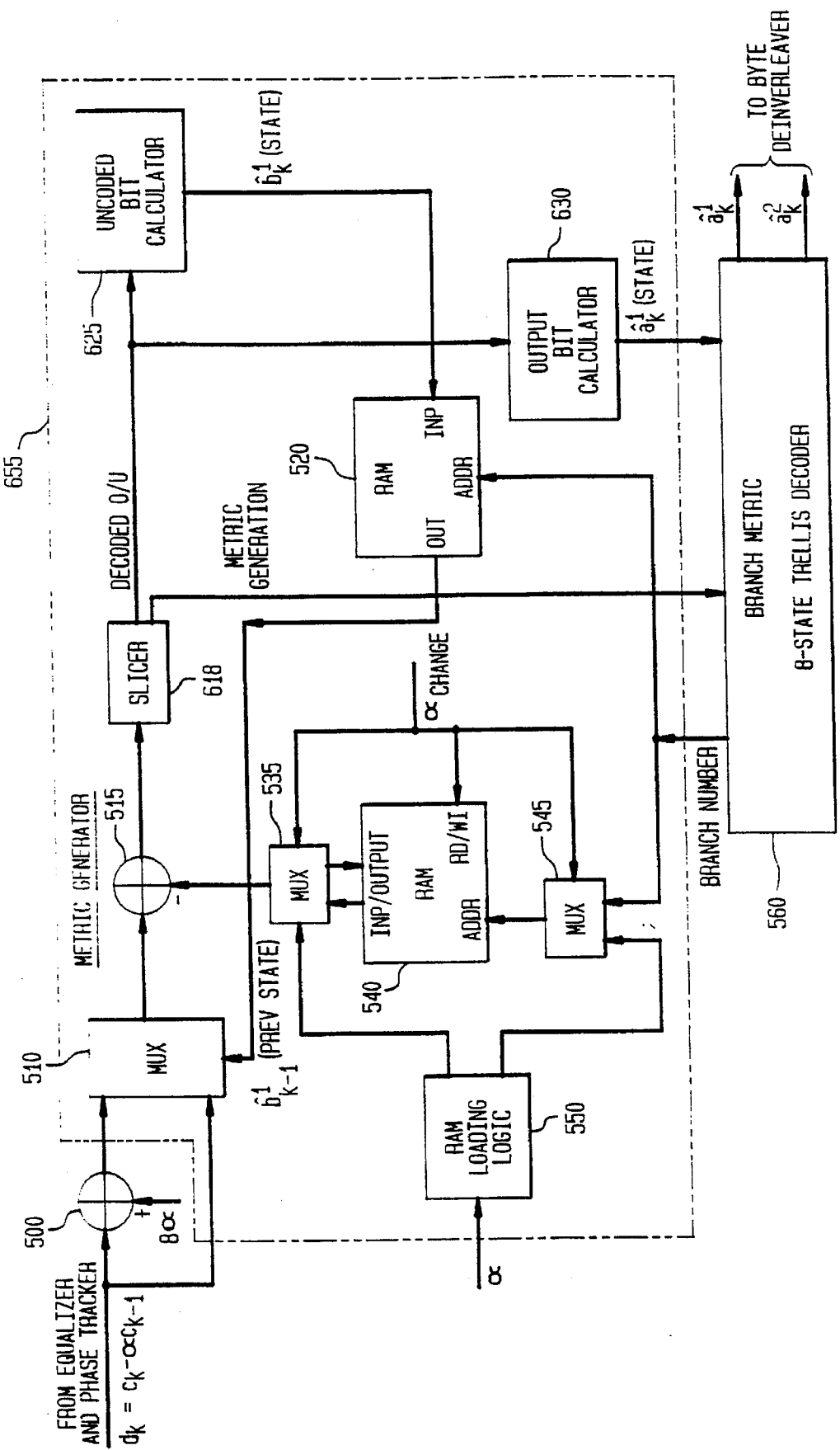
FIG. 14 shows another suboptimal 8-state trellis decoder using partial parallel-decision feedback decoding (PPDFD), in accordance with an alternate embodiment of the present invention.

Many modifications to the basic idea of reducing error-propagation by using either different slicers and/or different trellises and "partial" or complete feedback slicers are possible. One such modification is shown in FIG. 14. As shown in FIG. 14, the method of reducing error propagation by having the two possible metrics of Eq (10) and Eq (11) is not used. Instead, the metric is always:

$$\min_{b^1_{k,i}} |d_{k,i} - 8b^1_{k,i} - e_{k,i} \text{(branch with arbitrary } \alpha)|^2,$$

(for $i = 1$ to 12).

Therefore, only the slicer 618, the uncoded bit calculator 625, and the output bit calculator 630 change in the metric generator 655 as shown in FIG. 14.

According to the present invention, a whole class of trellis decoders can be generated which capitalize on partial or complete PDFD resulting in significant simplification of the trellis decoder when a variable comb filter is used.

One aspect of the present invention still left to be described is the method by which the value of a can be computed. Once the method for determining the value of $\alpha$ is selected for a particular application, the characteristic coefficient $\alpha$ is appropriately generated by the coefficient generator 96, as previously discussed.

One method of obtaining an estimate of $\alpha$ is by using the field sync symbols which are sent periodically by the VSB transmitter 4 of FIG. 1. These symbols are precisely known at the receiver. If $c_k$ is a transmitted symbol, then the received signal $r_k$ at the input to the variable comb filter can be written as:

$$r_k = c_k + \sum_{j \neq 0} h_j c_{k-j} + i_k + n_k, \quad \text{(EQ 12)}$$

where $$\sum_{j \neq 0} h_j c_{k-j}$$

is the multipath term, $i_k$ is the co-channel interference and $n_k$ is the additive noise term. The objective of the variable comb filter is to reduce the interference term $i_k$ and the noise $n_k$ simultaneously, while keeping the multipath term intact. If no multipath were present, then the output of the variable comb filter is given by:

$$c_k - \alpha c_{k-D} + i_k - \alpha i_{k-D} + n_k - \alpha n_{k-D}, \quad \text{(EQ 13)}$$

where D is a delay of 12 symbols. The total MSE (mean-square error) due to the interference and noise terms is given by:

$$MSE = E\{(i_k - \alpha i_{k-D})^2\} + E\{(n_k - \alpha n_{k-D})^2\}, \quad \text{(EQ 14)}$$

where it is assumed that the interference is independent of the additive noise and $E\{:\}$ denotes an expectation operator. It can then be shown that an optimal value of $\alpha$ is obtained by:

$$\alpha_{opt} = \frac{E\{i_k i_{k-D}\}}{(\sigma_i^2 + \sigma_n^2)}, \quad \text{(EQ 15)}$$

where $\sigma_i^2 = E\{i_k^2\}$ and $\sigma_n^2 = E\{n_k^2\}$. The question then is the design of an estimate which converges in some sense to the above optimal value of $\alpha$.

Since the field-sync symbols are known, it is easy to compute the value:

$$z_k = r_k - c_k = \sum_{j \neq 0} h_j c_{k-j} + i_k + n_k. \quad \text{(EQ 16)}$$

Then it can be shown that:

$$E\{z_k^2\} = \sigma_i^2 + \sigma_n^2 + \sigma_c^2 \sum_{j \neq 0} h_j^2, \quad \text{(EQ 17)}$$

and $$E\{(z_k - z_{k-D})^2\} = 2\sigma_n^2 + 2\sigma_c^2 \sum_{j \neq 0} h_j^2 + 2\sigma_i^2 - 2E\{i_k i_{k-D}\}, \quad \text{(EQ 18)}$$

and $$E\{(E\{z_k - z_{k-D}\})^2\} = 2\sigma_c^2 \sum_{j \neq 0} h_j^2, \quad \text{(EQ 19)}$$

where $\sigma_c^2 = E\{c_k^2\}$, and in Eq (19) it is assumed that an averaging is performed over the same set of transmitted symbols, which does not eliminate the signal component but eliminates only the noise as well as the interference where it is further assumed that the comb filter reduces the interference drastically, i.e., $E\{<E\{i_{k,i} - i_{k-D,i}\}>^2\} \approx 0$.

The averaging in Eq. (19) can be accomplished by averaging repeating sections of the same set of field sync symbols. Using Eqs. (17), (18) and (19), an estimate of the optimal value of $\alpha$ can be obtained by:

$$\alpha_{opt} = \frac{E\{z_k^2\} - E\{(z_k - z_{k-D})^2\}/2}{E\{z_k^2\} - E\{(E\{z_k - z_{k-D}\})^2\}/2}. \quad \text{(EQ 20)}$$

Another method of obtaining an accurate value of $\alpha$ is by using an adaptive LMS (least-mean-squares) algorithm known in the art. This algorithm can be applied over the cascade of the variable comb filter shown in FIG. 3 and the equalizer and the phase tracking circuit shown in FIG. 4 in a data-directed mode of operation. Here $\alpha$ will also be varied along with the coefficients of the forward and the feedback sections of the equalizer to minimize the MSE between the input and the output of the slicer 145 or 160 of FIG. 5.

In addition to the above determinations for a value of the characteristic coefficient $\alpha$, the value of $\alpha$ may further be selected from a number of discrete values within the range from 0 to 1, the number of discrete values being selected according to the requirements of a particular application.

Using modifiers slicers, trellis decoders, $\alpha$-estimators, as described herein above, the variable-comb filter implementation appears to be complete. However, segment sync symbols are periodically transmitted by the VSB transmitter 4. As explained earlier, these segment sync symbols are not inserted into the trellis-coded stream, but rather replace the outputs of trellis encoders which correspond to the segment sync symbols. At the same time as the transmission of the segment sync symbols, the trellis encoders whose output would be taken over by the segment sync symbols are kept frozen, i.e., no data is input to these trellis coders. The effect of this insertion can be studied as follows. Assume that the first segment sync symbol arrives at a time when Trellis Encoder #1 output of FIG. 1 would have gone. Instead, Trellis Encoders #1–4 inputs are frozen and four segment sync symbols are transmitted. After the segment sync symbols, the next symbol to be output is from Trellis Encoder #5.

If each trellis encoder is studied in isolation, then it is clear that Trellis Encoders #5–12 are unaffected by the insertion of segment sync. For Trellis Encoders #1–4, the output stream will be a sequence given by:

$$\ldots, c_{k-1,i}, c_{k,i}, p_i, c_{k+1,i}, c_{k+2,i}$$

where $p_i$ is one of the four segment sync symbols. If a comb filter is used then the sequence of symbols after the comb filter are:

$$\ldots, (c_{k,i} - c_{k-1,i}), (p_i - c_{k,i}), (c_{k+1,i} - p_i), (c_{k+2,i} - c_{k+1,i}), \ldots$$

For the trellis encoder, the symbol $(c_{k+1,i} - c_{k,i})$ should be obtained to allow for decoding based on the comb filter implementation. This can be easily obtained by adding $(c_{k+1, i} - \alpha p_i)$ and $(p_i - \alpha c_{k, i})$. Note that noise enhancement in this case is exactly the same as would be expected otherwise, since noise samples associated with the segment sync symbol $p_i$ also cancels out.

When the variable comb filter is implemented, the sequence of symbols is now:

$$\ldots, (c_{k, i} - \alpha c_{k-1, i}), (p_i - \alpha c_{k, i}), (c_{k+1, i} - \alpha p_i), (c_{k+2, i} - \alpha c_{k+1, i}), \ldots$$

From earlier discussions, the symbol corresponding to the segment sync symbol should preferably be $(c_{k+1, i} - \alpha c_{k, i})$. However, if $(c_{k+1, i} - \alpha p_i)$ and $(p_i - \alpha c_{k, i})$ are added and the term $p_i(1-\alpha)$ is subtracted at the receiver (since $p_i$ is known), it can be seen that the noise gets enhanced. This noise enhancement can be eliminated by implementing the following. Compute the sum: $(c_{k+1, i} - \alpha p_i) + \alpha(p_i - \alpha c_{k, i})$.

In this latter case, the symbol which is observed by the trellis decoder is $(c_{k+1, i} - \alpha^2 c_{k, i})$. Hence, during this symbol, the trellis decoder is operated assuming that the coefficient of the variable comb filter is $\alpha^2$ and not $\alpha$. It can be seen that for this particular symbol, the noise enhancement is lower than that of other symbols.

Thus there has been shown a method and apparatus which provide a co-channel interference filter for achieving improved performance which requires no discrete switching between a no-comb-filter solution and a comb-filter solution. The present invention further minimizes an error-propagation effect due to the use of a variable comb filter. In addition, the present invention further provides for the implementation of a class of sub-optimal 4-state or 8-state Viterbi decoders which have reduced complexity as compared to an optimal 16-state Viterbi decoder required for the variable comb filter implementation. Such a method and apparatus further provide that a performance of the variable comb filter is not degraded when the segment symbols are sent. Noise enhancement is advantageously lessened or made smaller.

While the invention has been particularly shown and described with reference to the preferred embodiment thereof, it will be understood by those skilled in the art that various changes in form and detail may be made therein without departing from the spirit and scope of the invention.

What is claimed is:

1. A co-channel interference filter for use in a television receiver, the television receiver receiving a signal transmitted from a transmitter, the received signal having an encoded digital television signal component, a co-channel interference component, and a noise component, wherein the encoded digital television signal component is characterized as an N-level vestigial sideband (VSB) signal of Reed-Solomon (R-S) encoded, byte interleaved and trellis encoded symbols $c_{k, i}$ (for i=1 to 12), where N corresponds to a number of levels, and wherein each symbol $c_{k, i}$ is derived from original symbol bits $a_{k, i}^1$ and $a_{k, i}^2$ (for i=1 to 12), corresponding to a most-significant symbol bit and a least significant symbol bit, respectively, said co-channel interference filter comprising:

means for generating a characteristic coefficient $\alpha$ in response to the received signal, wherein $\alpha$ is dependent upon an amount of the co-channel interference and noise components present in the received signal at a prescribed time, and wherein $\alpha$ comprises a value in the range of $0 \leq \alpha \leq 1$;

variable comb filter means for filtering the received signal and providing a filtered output signal, said variable comb filter means having a characteristic response of $1 - \alpha D^*$, wherein $D^*$ represents a delay of twelve VSB symbol intervals, and wherein the filtered output signal comprises an intersymbol interference (ISI) component;

means for equalizing and phase tracking the filtered output signal of said variable comb filter means, said equalizing and phase tracking means outputting an effective output signal represented by an expression $d_{k, i} = c_{k, i} - \alpha c_{k-1, i}$ (for i=1 to 12), where $c_{k, i}$ and $c_{k-1, i}$ correspond to an instantaneous symbol and a delayed symbol, respectively; and means, responsive to $\alpha$, for trellis decoding the output signal $d_{k, i}$ of said equalizing and phase tracking means, said trellis decoding means providing a trellis decoded output signal of symbol bits $\hat{a}_{k, i}^1$ and $\hat{a}_{k, i}^2$ of trellis decoded symbols, corresponding to the original symbol bits $a_{k, i}^1$ and $a_{k, i}^2$, respectively, and removing the ISI component introduced by the variable comb filter means.

2. The co-channel interference filter of claim 1, wherein said characteristic coefficient generating means estimates the value of $\alpha$ based upon field sync symbols contained within the received signal.

3. The co-channel interference filter of claim 2, wherein said characteristic coefficient generating means further selects the value of $\alpha$ from a number of discrete values in the range from 0 to 1.

4. The co-channel interference filter of claim 1, wherein said characteristic coefficient generating means selects the value of $\alpha$ from a number of discrete values in the range from 0 to 1.

5. The co-channel interference filter of claim 1, wherein said characteristic coefficient generating means estimates the value of $\alpha$ based upon an adaptive least-means-squares algorithm.

6. The co-channel interference filter of claim 1, wherein said equalizing and phase tracking means comprises a slicer.

7. The co-channel interference filter of claim 1, wherein said equalizing and phase tracking means comprises a modified slicer having a first path and a second path, the first path performing an 8-level slicing operation, and the second path performing a 15-level slicing operation, said equalizing and phase tracking means further comprising means for selectively switching an input and an output of the modified slicer between the first path and the second path in response to the value of $\alpha$ being within a first range and a second range, respectively.

8. The co-channel interference filter of claim 1, wherein said trellis decoding means comprises twelve trellis decoders arranged in parallel, each of the twelve trellis decoders comprising an input and an output, said trellis decoding means further comprising means for switching an input and an output of said trellis decoding means, in a prescribed manner, through the twelve inputs and outputs of the parallel-arranged trellis decoders, one trellis decoder at a time.

9. The co-channel interference filter of claim 8, wherein each of the twelve parallel-arranged trellis decoders comprises a 16-State trellis decoder.

10. The co-channel interference filter of claim 8, wherein each of the twelve parallel-arranged trellis decoders comprises a 4-State trellis decoder using parallel-decision feedback decoding.

11. The co-channel interference filter of claim 8, wherein each of the twelve parallel-arranged trellis decoders comprises an 8-State trellis decoder using parallel-decision feedback decoding.

12. The co-channel interference filter of claim 8, wherein each of the twelve parallel-arranged trellis decoders comprises an 8-State trellis decoder using partial parallel-decision feedback decoding.

13. The co-channel interference filter of claim 12, wherein the 8-State trellis decoder using partial parallel-decision feedback decoding comprises a metric generator utilizing a dual path slicer.

14. The co-channel interference filter of claim 12, wherein the 8-State trellis decoder using partial parallel-decision feedback decoding comprises a metric generator utilizing a single path slicer.

15. The co-channel interference filter of claim 8, wherein said characteristic coefficient generating means estimates the value of $\alpha$ based upon field sync symbols contained within the received signal.

16. The co-channel interference filter of claim 15, wherein said characteristic coefficient generating means further selects the value of $\alpha$ from a number of discrete values in the range from 0 to 1.

17. The co-channel interference filter of claim 8, wherein said characteristic coefficient generating means selects the value of $\alpha$ from a number of discrete values in the range from 0 to 1.

18. The co-channel interference filter of claim 8, wherein said characteristic coefficient generating means estimates the value of $\alpha$ based upon an adaptive least-means-squares algorithm.

19. The co-channel interference filter of claim 8, wherein said equalizing and phase tracking means comprises a slicer.

20. The co-channel interference filter of claim 8, wherein said equalizing and phase tracking means comprises a modified slicer having a first path and a second path, the first path performing an 8-level slicing operation, and the second path performing a 15-level slicing operation, said equalizing and phase tracking means further comprising means for selectively switching an input and an output of the modified slicer between the first path and the second path in response to the value of $\alpha$ being within a first range and a second range, respectively.

21. The co-channel interference filter of claim 20, wherein each of the twelve parallel-arranged trellis decoders comprises a 16-State trellis decoder.

22. The co-channel interference filter of claim 20, wherein each of the twelve parallel-arranged trellis decoders comprises a 4-State trellis decoder using parallel-decision feedback decoding.

23. The co-channel interference filter of claim 20, wherein each of the twelve parallel-arranged trellis decoders comprises an 8-State trellis decoder using parallel-decision feedback decoding.

24. The co-channel interference filter of claim 20, wherein each of the twelve parallel-arranged trellis decoders comprises an 8-State trellis decoder using partial parallel-decision feedback decoding.

25. The co-channel interference filter of claim 24, wherein the 8-State trellis decoder using partial parallel-decision feedback decoding comprises a metric generator utilizing a dual path slicer.

26. The co-channel interference filter of claim 24, wherein the 8-State trellis decoder using partial parallel-decision feedback decoding comprises a metric generator utilizing a single path slicer.

27. A method of reducing co-channel interference in a received television signal, the received television signal having been transmitted from a transmitter, the received television signal further having an encoded digital television signal component, a co-channel interference component, and a noise component, wherein the encoded digital television signal component is characterized as an N-level vestigial sideband (VSB) signal of Reed-Solomon (R-S) encoded, byte interleaved and trellis encoded symbols $c_{k,i}$ (for i=1 to 12), where N corresponds to a number of levels, and wherein each symbol $c_{k,i}$ is derived from original symbol bits $a_{k,i}^1$ and $a_{k,i}^2$ (for i=1 to 12), corresponding to a most-significant symbol bit and a least significant symbol bit, respectively, said method comprising the steps:

generating a characteristic coefficient $\alpha$ in response to the received television signal, wherein $\alpha$ is dependent upon an amount of the co-channel interference and noise components present in the received signal at a prescribed time, and wherein $\alpha$ comprises a value in the range of $0 \leq \alpha \leq 1$;

variable comb filtering the received television signal and providing a filtered output signal, said variable comb filtering step including filtering with a characteristic response of $1-\alpha D^*$, wherein $D^*$ represents a delay of twelve VSB symbol intervals, and wherein the filtered output signal comprises an intersymbol interference (ISI) component;

equalizing and phase tracking the variable comb filtered output signal and providing an equalized and phase tracked effective output signal represented by an expression $d_{k,i} = c_{k,i} - \alpha c_{k-1,i}$ (for i=1 to 12), where $c_{k,i}$ and $c_{k-1,i}$ correspond to an instantaneous symbol and a delayed symbol, respectively; and trellis decoding the effective output signal $d_{k,i}$ of said equalizing and phase tracking step in response to $\alpha$, said trellis decoding step providing a trellis decoded output signal of symbol bits $\hat{a}_{k,i}^1$ and $\hat{a}_{k,i}^2$ of trellis decoded symbols, corresponding to the original symbol bits $a_{k,i}^1$ and $a_{k,i}^2$, respectively, and removing the ISI component introduced by the variable comb filtering step.

28. The method of reducing co-channel interference of claim 27, wherein said step of generating the characteristic coefficient comprises estimating the value of $\alpha$ based upon field sync symbols contained within the received signal.

29. The method of reducing co-channel interference of claim 28, wherein said step of generating the characteristic coefficient further comprises selecting the value of $\alpha$ from a number of discrete values in the range from 0 to 1.

30. The method of reducing co-channel interference of claim 27, wherein said step of generating the characteristic coefficient comprises selecting the value of $\alpha$ from a number of discrete values in the range from 0 to 1.

31. The method of reducing co-channel interference of claim 27, wherein said step of generating the characteristic coefficient comprises estimating the value of $\alpha$ based upon an adaptive least-means-squares algorithm.

32. The method of reducing co-channel interference of claim 27, wherein said equalizing and phase tracking step comprises a step of slicing.

33. The method of reducing co-channel interference of claim 27, wherein said equalizing and phase tracking step comprises a step of slicing having a first path and a second path, the first path performing an 8-level slicing operation, and the second path performing a 15-level slicing operation, said slicing step further comprising selectively switching between the first path and the second path in response to the value of $\alpha$ being within a first range and a second range, respectively.

34. The method of reducing co-channel interference of claim 27, wherein said step of trellis decoding comprises providing twelve trellis decoding operations arranged in parallel, said step of trellis decoding comprising switching, in a prescribed manner, through the twelve parallel-arranged trellis decoding operations to trellis decode the effective output signal, one trellis decoding operation at a time.

35. The method of reducing co-channel interference of claim 34, wherein each of the twelve parallel-arranged trellis decoding operations provided in said trellis decoding step comprises 16-State trellis decoding.

36. The method of reducing co-channel interference of claim 34, wherein each of the twelve parallel-arranged trellis decoding operations provided in said trellis decoding step comprises 4-State trellis decoding using parallel-decision feedback decoding.

37. The method of reducing co-channel interference of claim 34, wherein each of the twelve parallel-arranged trellis decoding operations provided in said trellis decoding step comprises 8-State trellis decoding using parallel-decision feedback decoding.

38. The method of reducing co-channel interference of claim 34, wherein each of the twelve parallel-arranged trellis decoding operations provided in said trellis decoding step comprises 8-State trellis decoding using partial parallel-decision feedback decoding.

39. The method of reducing co-channel interference of claim 38, wherein the 8-State trellis decoding using partial parallel-decision feedback decoding comprises metric generation using dual path slicing.

40. The method of reducing co-channel interference of claim 38, wherein the 8-State trellis decoding using partial parallel-decision feedback decoding comprises metric generation using single path slicing.

41. The method of reducing co-channel interference of claim 34, wherein said step of generating the characteristic coefficient comprises estimating the value of $\alpha$ based upon field sync symbols contained within the received signal.

42. The method of reducing co-channel interference of claim 41, wherein said step of generating the characteristic coefficient further comprises selecting the value of $\alpha$ from a number of discrete values in the range from 0 to 1.

43. The method of reducing co-channel interference of claim 34, wherein said step of generating the characteristic coefficient comprises selecting the value of $\alpha$ from a number of discrete values in the range from 0 to 1.

44. The method of reducing co-channel interference of claim 34, wherein said step of generating the characteristic coefficient comprises estimating the value of $\alpha$ based upon an adaptive least-means-squares algorithm.

45. The method of reducing co-channel interference of claim 34, wherein said equalizing and phase tracking step comprises a step of slicing.

46. The method of reducing co-channel interference of claim 34, wherein said equalizing and phase tracking step comprises a step of slicing having a first path and a second path, the first path performing an 8-level slicing operation, and the second path performing a 15-level slicing operation, said slicing step further comprising selectively switching between the first path and the second path in response to the value of $\alpha$ being within a first range and a second range, respectively.

47. The method of reducing co-channel interference of claim 46, wherein each of the twelve parallel-arranged trellis decoding operations provided in said trellis decoding step comprises 16-State trellis decoding.

48. The method of reducing co-channel interference of claim 46, wherein each of the twelve parallel-arranged trellis decoding operations provided in said trellis decoding step comprises 4-State trellis decoding using parallel-decision feedback decoding.

49. The method of reducing co-channel interference of claim 46, wherein each of the twelve parallel-arranged trellis decoding operations provided in said trellis decoding step comprises 8-State trellis decoding using parallel-decision feedback decoding.

50. The method of reducing co-channel interference of claim 46, wherein each of the twelve parallel-arranged trellis decoding operations provided in said trellis decoding step comprises 8-State trellis decoding using partial parallel-decision feedback decoding.

51. The method of reducing co-channel interference of claim 50, wherein the 8-State trellis decoding using partial parallel-decision feedback decoding comprises metric generation using dual path slicing.

52. The method of reducing co-channel interference of claim 50, wherein the 8-State trellis decoding using partial parallel-decision feedback decoding comprises metric generation using single path slicing.

53. A television receiver comprising:

means for receiving a signal transmitted from a transmitter, the received signal further having an encoded digital television signal component, a co-channel interference component, and a noise component, wherein the encoded digital television signal component is characterized as an N-level vestigial sideband (VSB) signal of Reed-Solomon (R-S) encoded, byte interleaved and trellis encoded symbols $c_{k,i}$ (for i=1 to 12), where N corresponds to a number of levels, and wherein each symbol $c_{k,i}$ is derived from original symbol bits $a_{k,i}^1$ and $a_{k,i}^2$ (for i=1 to 12), corresponding to a most-significant symbol bit and a least significant symbol bit, respectively;

means for generating a characteristic coefficient $\alpha$ in response to the received signal, wherein $\alpha$ is dependent upon an amount of the co-channel interference and noise components present in the received signal at a prescribed time, and wherein $\alpha$ comprises a value in the range of $0 \leq \alpha \leq 1$;

variable comb filter means for filtering the received signal and providing a filtered output signal, said variable comb filter means having a characteristic response of $1-\alpha D^*$, wherein $D^*$ represents a delay of twelve VSB symbol intervals, and wherein the filtered output signal comprises an intersymbol interference (ISI) component;

means for equalizing and phase tracking the filtered output signal of said variable comb filter means, said equalizing and phase tracking means outputting an effective output signal represented by an expression $d_{k,i} = c_{k,i} - \alpha c_{k-1,i}$ (for i=1 to 12), where $c_{k,i}$ and $c_{k-1,i}$ correspond to an instantaneous symbol and a delayed symbol, respectively;

means, responsive to $\alpha$, for trellis decoding the output signal $d_{k,i}$ of said equalizing and phase tracking means, said trellis decoding means providing a trellis decoded output signal of symbol bits $\hat{a}_{k,i}^1$ and $\hat{a}_{k,i}^2$ of trellis decoded symbols corresponding to the original symbol bits $a_{k,i}^1$ and $a_{k,i}^2$, respectively, and removing the ISI component introduced by the variable comb filter means;

byte de-interleaving means for byte de-interleaving the symbols of the trellis decoded output signal to produce a byte de-interleaved digital television signal; and R-S decoder means for decoding the byte de-interleaved digital television signal.

54. The television receiver of claim 53, wherein said characteristic coefficient generating means estimates the value of α based upon field sync symbols contained within the received signal.

55. The television receiver of claim 54, wherein said characteristic coefficient generating means further selects the value of α from a number of discrete values in the range from 0 to 1.

56. The television receiver of claim 53, wherein said characteristic coefficient generating means selects the value of α from a number of discrete values in the range from 0 to 1.

57. The television receiver of claim 53, wherein said characteristic coefficient generating means estimates the value of α based upon an adaptive least-means-squares algorithm.

58. The television receiver of claim 53, wherein said equalizing and phase tracking means comprises a slicer.

59. The television receiver of claim 53, wherein said equalizing and phase tracking means comprises a modified slicer having a first path and a second path, the first path performing an 8-level slicing operation, and the second path performing a 15-level slicing operation, said equalizing and phase tracking means further comprising means for selectively switching an input and an output of the modified slicer between the first path and the second path in response to the value of α being within a first range and a second range, respectively.

60. The television receiver of claim 53, wherein said trellis decoding means comprises twelve trellis decoders arranged in parallel, each of the twelve trellis decoders comprising an input and an output, said trellis decoding means further comprising means for switching an input and an output of said trellis decoding means, in a prescribed manner, through the twelve inputs and outputs of the parallel-arranged trellis decoders, one trellis decoder at a time.

61. The television receiver of claim 60, wherein each of the twelve parallel-arranged trellis decoders comprises a 16-State trellis decoder.

62. The television receiver of claim 60, wherein each of the twelve parallel-arranged trellis decoders comprises a 4-State trellis decoder using parallel-decision feedback decoding.

63. The television receiver of claim 60, wherein each of the twelve parallel-arranged trellis decoders comprises an 8-State trellis decoder using parallel-decision feedback decoding.

64. The television receiver of claim 60, wherein each of the twelve parallel-arranged trellis decoders comprises an 8-State trellis decoder using partial parallel-decision feedback decoding.

65. The television receiver of claim 64, wherein the 8-State trellis decoder using partial parallel-decision feedback decoding comprises a metric generator utilizing a dual path slicer.

66. The television receiver of claim 64, wherein the 8-State trellis decoder using partial parallel-decision feedback decoding comprises a metric generator utilizing a single path slicer.

67. The television receiver of claim 60, wherein said characteristic coefficient generating means estimates the value of α based upon field sync symbols contained within the received signal.

68. The television receiver of claim 67, wherein said characteristic coefficient generating means further selects the value of α from a number of discrete values in the range from 0 to 1.

69. The television receiver of claim 60, wherein said characteristic coefficient generating means selects the value of α from a number of discrete values in the range from 0 to 1.

70. The television receiver of claim 60, wherein said characteristic coefficient generating means estimates the value of α based upon an adaptive least-means-squares algorithm.

71. The television receiver of claim 60, wherein said equalizing and phase tracking means comprises a slicer.

72. The television receiver of claim 60, wherein said equalizing and phase tracking means comprises a modified slicer having a first path and a second path, the first path performing an 8-level slicing operation, and the second path performing a 15-level slicing operation, said equalizing and phase tracking means further comprising means for selectively switching an input and an output of the modified slicer between the first path and the second path in response to the value of α being within a first range and a second range, respectively.

73. The television receiver of claim 72, wherein each of the twelve parallel-arranged trellis decoders comprises a 16-State trellis decoder.

74. The television receiver of claim 72, wherein each of the twelve parallel-arranged trellis decoders comprises a 4-State trellis decoder using parallel-decision feedback decoding.

75. The television receiver of claim 72, wherein each of the twelve parallel-arranged trellis decoders comprises an 8-State trellis decoder using parallel-decision feedback decoding.

76. The television receiver of claim 72, wherein each of the twelve parallel-arranged trellis decoders comprises an 8-State trellis decoder using partial parallel-decision feedback decoding.

77. The television receiver of claim 76, wherein the 8-State trellis decoder using partial parallel-decision feedback decoding comprises a metric generator utilizing a dual path slicer.

78. The television receiver of claim 76, wherein the 8-State trellis decoder using partial parallel-decision feedback decoding comprises a metric generator utilizing a single path slicer.

79. A method of receiving a television signal transmitted from a transmitter and reducing co-channel interference in the received television signal, said method comprising the steps:

receiving the television signal, the received television signal having an encoded digital television signal component, a co-channel interference component, and a noise component, wherein the encoded digital television signal component is characterized as an N-level vestigial sideband (VSB) signal of Reed-Solomon (R-S) encoded, byte interleaved and trellis encoded symbols $c_{k,i}$ (for i=1 to 12), where N corresponds to a number of levels, and wherein each symbol $c_{k,i}$ is derived from original symbol bits $a_{k,i}^1$ and $a_{k,i}^2$ (for i=1 to 12), corresponding to a most-significant symbol bit and a least significant symbol bit, respectively;

generating a characteristic coefficient α in response to the received television signal, wherein α is dependent upon an amount of the co-channel interference and noise components present in the received television signal at a prescribed time, and wherein α comprises a value in the range of $0 \leq \alpha \leq 1$;

variable comb filtering the received television signal and providing a filtered output signal, said variable comb filtering step including filtering with a characteristic response of $1-\alpha D^*$, wherein $D^*$ represents a delay of twelve VSB symbol intervals, and wherein the filtered output signal comprises an intersymbol interference (ISI) component;

equalizing and phase tracking the variable comb filtered output signal and providing an equalized and phase tracked effective output signal represented by an expression $d_{k,i} = c_{k,i} - \alpha c_{k-1,i}$ (for i=1 to 12), where $c_{k,i}$ and $c_{k-1,i}$ correspond to an instantaneous symbol and a delayed symbol, respectively;

trellis decoding the effective output signal $d_{k,i}$ of said equalizing and phase tracking step in response to $\alpha$, said trellis decoding step further providing a trellis decoded output signal of symbol bits $\hat{a}_{k,i}^1$ and $\hat{a}_{k,i}^2$ of trellis decoded symbols corresponding to the original symbol bits $a_{k,i}^1$ and $a_{k,i}^2$, respectively, and removing the ISI component introduced by the variable comb filtering step;

byte de-interleaving the symbols of the trellis decoded output signal to produce a byte de-interleaved digital television signal; and R-S decoding the byte de-interleaved digital television signal.

80. The method of receiving a television signal of claim 79, wherein said step of generating the characteristic coefficient comprises estimating the value of $\alpha$ based upon field sync symbols contained within the received television signal.

81. The method of receiving a television signal of claim 80, wherein said step of generating the characteristic coefficient further comprises selecting the value of $\alpha$ from a number of discrete values in the range from 0 to 1.

82. The method of receiving a television signal of claim 79, wherein said step of generating the characteristic coefficient comprises selecting the value of $\alpha$ from a number of discrete values in the range from 0 to 1.

83. The method of receiving a television signal of claim 79, wherein said step of generating the characteristic coefficient comprises estimating the value of $\alpha$ based upon an adaptive least-means-squares algorithm.

84. The method of receiving a television signal of claim 79, wherein said equalizing and phase tracking step comprises a step of slicing.

85. The method of receiving a television signal of claim 79, wherein said equalizing and phase tracking step comprises a step of slicing having a first path and a second path, the first path performing an 8-level slicing operation, and the second path performing a 15-level slicing operation, said slicing step further comprising selectively switching between the first path and the second path in response to the value of $\alpha$ being within a first range and a second range, respectively.

86. The method of receiving a television signal of claim 79, wherein said step of trellis decoding further comprises twelve trellis decoding operations arranged in parallel, said step of trellis decoding further comprising switching, in a prescribed manner, through the twelve parallel-arranged trellis decoding operations to trellis decode the effective output signal, one trellis decoding at a time.

87. The method of receiving a television signal of claim 86, wherein each of the twelve parallel-arranged trellis decoding operations provided in said trellis decoding step comprises 16-State trellis decoding.

88. The method of receiving a television signal of claim 86, wherein each of the twelve parallel-arranged trellis decoding operations provided in said trellis decoding step comprises 4-State trellis decoding using parallel-decision feedback decoding.

89. The method of receiving a television signal of claim 86, wherein each of the twelve parallel-arranged trellis decoding operations provided in said trellis decoding step comprises 8-State trellis decoding using parallel-decision feedback decoding.

90. The method of receiving a television signal of claim 86, wherein each of the twelve parallel-arranged trellis decoding operations provided in said trellis decoding step comprises 8-State trellis decoding using partial parallel-decision feedback decoding.

91. The method of receiving a television signal of claim 90, wherein the 8-State trellis decoding using partial parallel-decision feedback decoding comprises metric generation using dual path slicing.

92. The method of receiving a television signal of claim 90, wherein the 8-State trellis decoding using partial parallel-decision feedback decoding comprises metric generation using single path slicing.

93. The method of receiving a television signal of claim 86, wherein said step of generating the characteristic coefficient comprises estimating the value of $\alpha$ based upon field sync symbols contained within the received television signal.

94. The method of receiving a television signal of claim 93, wherein said step of generating the characteristic coefficient comprises selecting the value of $\alpha$ from a number of discrete values in the range from 0 to 1.

95. The method of receiving a television signal of claim 86, wherein said step of generating the characteristic coefficient comprises selecting the value of $\alpha$ from a number of discrete values in the range from 0 to 1.

96. The method of receiving a television signal of claim 86, wherein said step of generating the characteristic coefficient comprises estimating the value of $\alpha$ based upon an adaptive least-means-squares algorithm.

97. The method of receiving a television signal of claim 86, wherein said equalizing and phase tracking step comprises a step of slicing.

98. The method of receiving a television signal of claim 86, wherein said equalizing and phase tracking step comprises a step of slicing having a first path and a second path, the first path performing an 8-level slicing operation, and the second path performing a 15-level slicing operation, said slicing step further comprising selectively switching between the first path and the second path in response to the value of $\alpha$ being within a first range and a second range, respectively.

99. The method of receiving a television signal of claim 98, wherein each of the twelve parallel-arranged trellis decoding operations provided in said trellis decoding step comprises 16-State trellis decoding.

100. The method of receiving a television signal of claim 98, wherein each of the twelve parallel-arranged trellis decoding operations provided in said trellis decoding step comprises 4-State trellis decoding using parallel-decision feedback decoding.

101. The method of receiving a television signal of claim 98, wherein each of the twelve parallel-arranged trellis decoding operations provided in said trellis decoding step comprises 8-State trellis decoding using parallel-decision feedback decoding.

102. The method of receiving a television signal of claim 98, wherein each of the twelve parallel-arranged trellis decoding operations provided in said trellis decoding step comprises 8-State trellis decoding using partial parallel-decision feedback decoding.

103. The method of receiving a television signal of claim 102, wherein the 8-State trellis decoding using partial parallel-decision feedback decoding comprises metric generation using dual path slicing.

104. The method of receiving a television signal of claim 102, wherein the 8-State trellis decoding using partial parallel-decision feedback decoding comprises metric generation using single path slicing.

\* \* \* \* \*